(12) United States Patent
Lee

(10) Patent No.: US 8,574,820 B2
(45) Date of Patent: Nov. 5, 2013

(54) METHOD FOR FABRICATING SEMICONDUCTOR DEVICE

(75) Inventor: Chang-Goo Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 231 days.

(21) Appl. No.: 12/917,712

(22) Filed: Nov. 2, 2010

(65) Prior Publication Data

US 2011/0223541 A1    Sep. 15, 2011

(30) Foreign Application Priority Data

Mar. 10, 2010    (KR) ........................ 10-2010-0021209

(51) Int. Cl.
*G03F 7/26* (2006.01)
(52) U.S. Cl.
USPC ......................................................... 430/314
(58) Field of Classification Search
USPC ......................................... 430/311, 313, 314
See application file for complete search history.

(56) References Cited

U.S. PATENT DOCUMENTS

| 6,110,624 A * | 8/2000 | Hibbs et al. ....................... 430/5 |
| 2010/0055913 A1* | 3/2010 | Zhang et al. .................. 438/697 |
| 2012/0244478 A1* | 9/2012 | Nakamura et al. ............ 430/326 |

FOREIGN PATENT DOCUMENTS

| KR | 1020070006055 | 1/2007 |
| KR | 1020100014831 | 2/2010 |
| KR | 10-2011-0008495 | 1/2011 |

* cited by examiner

*Primary Examiner* — Kathleen Duda
(74) *Attorney, Agent, or Firm* — IP & T Group LLP

(57) ABSTRACT

A method for fabricating a semiconductor device includes: forming a first photoresist pattern with a first opening over an etch target layer; forming a second photoresist pattern with a plurality of second openings over the first photoresist pattern; and forming a plurality of patterns by etching the etch target layer by using the first photoresist pattern and the second photoresist pattern as an etch barrier.

20 Claims, 28 Drawing Sheets

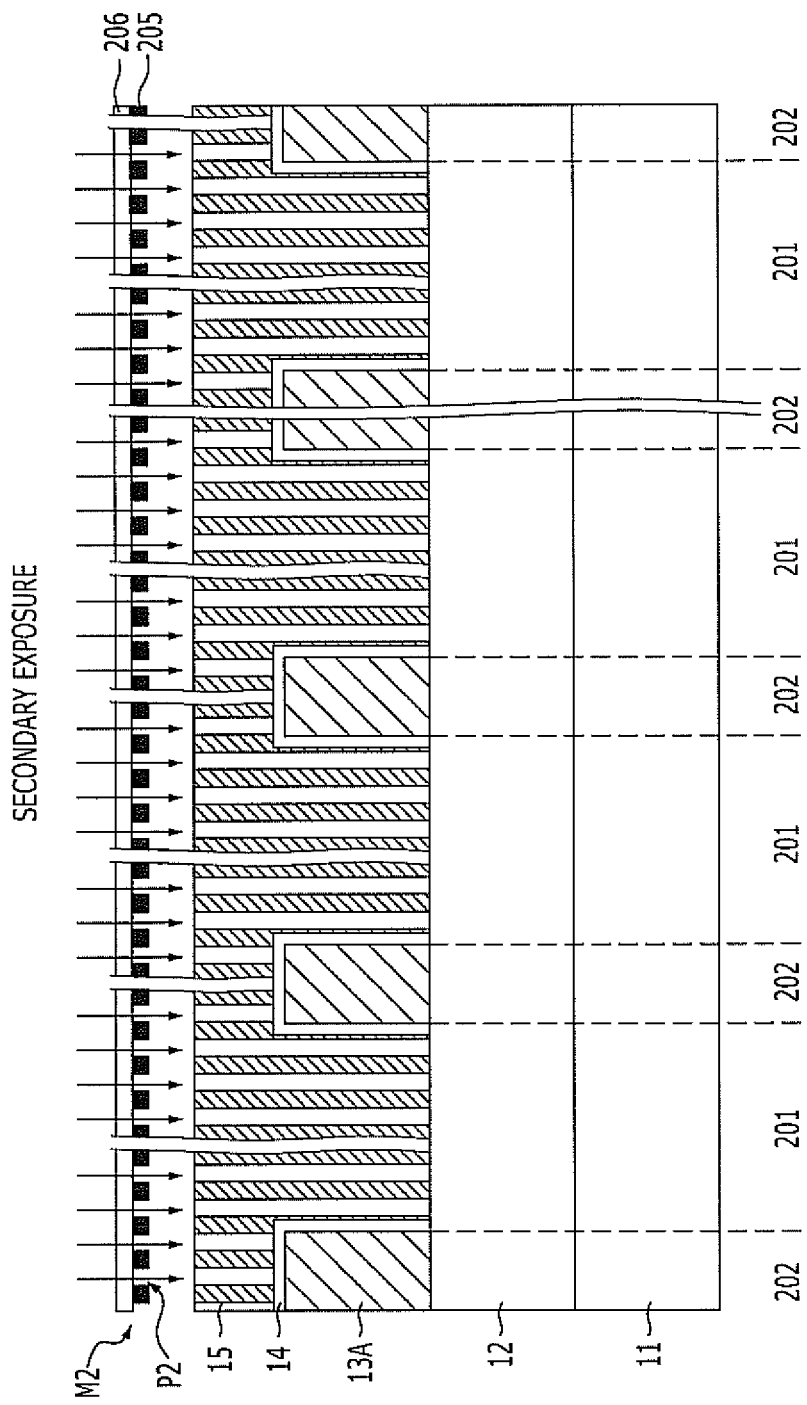

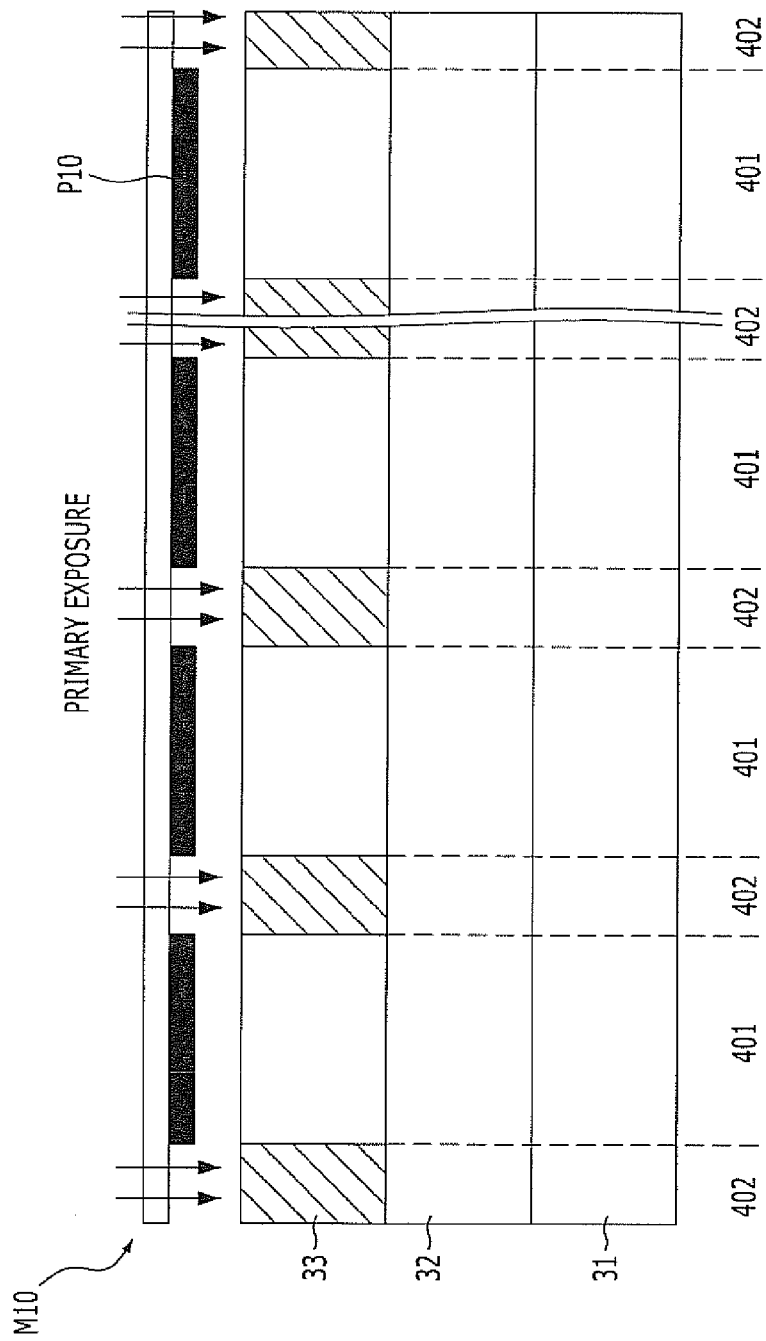

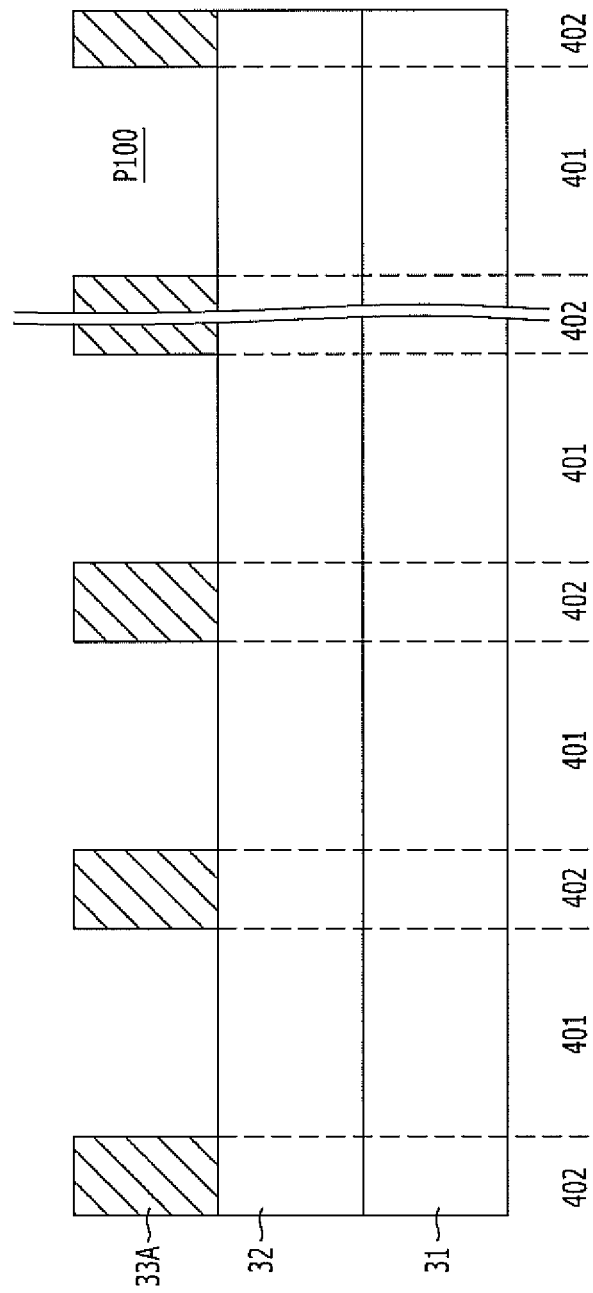

METHOD FOR FABRICATING SEMICONDUCTOR DEVICE

CROSS-REFERENCE TO RELATED APPLICATIONS

The present application claims priority of Korean Patent Application No. 10-2010-0021209, filed on Mar. 10, 2010, which is incorporated herein by reference in its entirety.

BACKGROUND OF THE INVENTION

Exemplary embodiments of the present invention relate to a method for fabricating a semiconductor device, and more particularly, to a method for fabricating a semiconductor device, which can secure a pattern uniformity.

A dynamic random access memory (DRAM) includes: a plurality of cell arrays each having a plurality of cells arranged therein; and a sub-word line driver (SWD) and a sense amplifier (SA) disposed between the cell arrays. Generally, the cell array is also called a cell matrix.

FIG. 1 is a plan view illustrating a DRAM to describe a basic structure of a cell array.

Referring to FIG. 1, a sub-word line driver (SWD) 103 and a sense amplifier (SA) 104 are disposed between cell arrays 101. For example, a sub-word line driver (SWD) 103 is disposed between cell arrays 101 of a first direction X, and a sense amplifier (SA) 104 is disposed between cell arrays 101 of a second direction Y. A reference numeral 102 denotes a bank. A plurality of cell arrays 101 are disposed in each bank 102.

Each cell array 101 includes a plurality of about 256 K to about 2 M (Mega) cells.

FIG. 2 is a plan view illustrating a detailed structure of the cell array 101 having a plurality of patterns formed therein.

Referring to FIG. 2, a plurality of patterns 105 such as contact holes are formed in the cell array 101.

As the design rule of the DRAM becomes 100 nm or less, it is difficult to form the patterns 105 such as contact holes at an edge 101A of the cell array 101. Accordingly, defects in the edge 101A of the cell array 101 are on the increase.

The conventional method uses one photoresist pattern to form patterns 105 in the cell array 101 including its edge. That is, one mask process and etching process are used to form a plurality of patterns 105. The mask process includes photoresist (PR) coating, exposure and develop processes. Accordingly, there occurs a distortion phenomenon 105A where patterns 105 are not formed at the edge of the cell array 101 or are formed to be smaller at the edge of the cell array 101 than other regions in the cell array 101.

Such distortions in patterning an edge of a cell array in a DRAM fabrication process, that is, in exposing/etching an edge of a cell array, may degrade the output yield of DRAMs according a 30 nm design rule.

A method of forming the pattern at the edge of the cell array to a different size by changing masks several times is mainly used as a method for addressing the distortion phenomenon where the pattern at the edge of the cell array is formed to have a different size from the pattern in the whole cell array.

However, fabricating expensive masks several times may increase the cost of the DRAMs and also reduce the yield of DRAMs because the margin limitation of the current design rule causes a defect in the cells of the cell array edge.

SUMMARY OF THE INVENTION

An exemplary embodiment of the present invention is directed to a method for fabricating a semiconductor device, which can form uniform patterns in a whole cell array including its edge.

In accordance with an exemplary embodiment of the present invention, a method for fabricating a semiconductor device includes: forming a first photoresist pattern with a first opening over an etch target layer; forming a second photoresist pattern with a plurality of second openings over the first photoresist pattern; and forming a plurality of patterns by etching the etch target layer by using the first photoresist pattern and the second photoresist pattern as an etch barrier.

In accordance with another exemplary embodiment of the present invention, a method for fabricating a semiconductor device includes: forming an etch target layer over a substrate having a first region and a second region defined therein; selectively exposing the first region to light to form a first photoresist pattern with a first opening over the etch target layer; forming a shielding layer over the surface of the first photoresist pattern; simultaneously exposing the first region and the second region to light to form a second photoresist pattern with a plurality of second openings over the first photoresist pattern covered with the shielding layer; and forming a plurality of patterns by etching the etch target layer by using the first photoresist pattern and the second photoresist pattern as an etch barrier.

In accordance with still another exemplary embodiment of the present invention, a method for fabricating a semiconductor device includes: forming an etch target layer over a substrate having a first region and a second region defined therein; forming a negative-type photoresist pattern with a first opening over the etch target layer, the first opening corresponding to the first region; simultaneously exposing the first region and the second region to light to form a positive-type photoresist pattern, which has a plurality of second openings over the first and second regions, over the negative-type photoresist pattern, the second opening corresponding to a plurality of pattern to be formed in the etch target layer of the first region; and forming the plurality of patterns by etching the etch target layer by using the negative-type photoresist pattern and the positive-type photoresist pattern as an etch barrier.

In accordance with still another exemplary embodiment of the present invention, a method for fabricating a semiconductor device includes: forming an etch target layer over a substrate having a first region and a second region; forming a first photoresist pattern with a first opening over the etch target layer, the first opening corresponding to the first region; forming a shielding layer over the surface of the first photoresist pattern; forming a second photoresist pattern, which has a plurality of second openings over the first and second regions, over the first photoresist pattern covered with the shielding layer, the second opening corresponding to a pattern to be formed in the etch target layer of the first region; and forming the pattern by etching the etch target layer by using the first photoresist pattern and the second photoresist pattern as an etch barrier.

BRIEF DESCRIPTION OF THE DRAWINGS

FIGS. 4A to 4F are cross-sectional views taken along lines A-A' of FIGS. 3A to 3F.

FIGS. 7A to 7E are cross-sectional views taken along lines A-A' of FIGS. 6A to 6E.

DESCRIPTION OF SPECIFIC EMBODIMENTS

Figure 1:
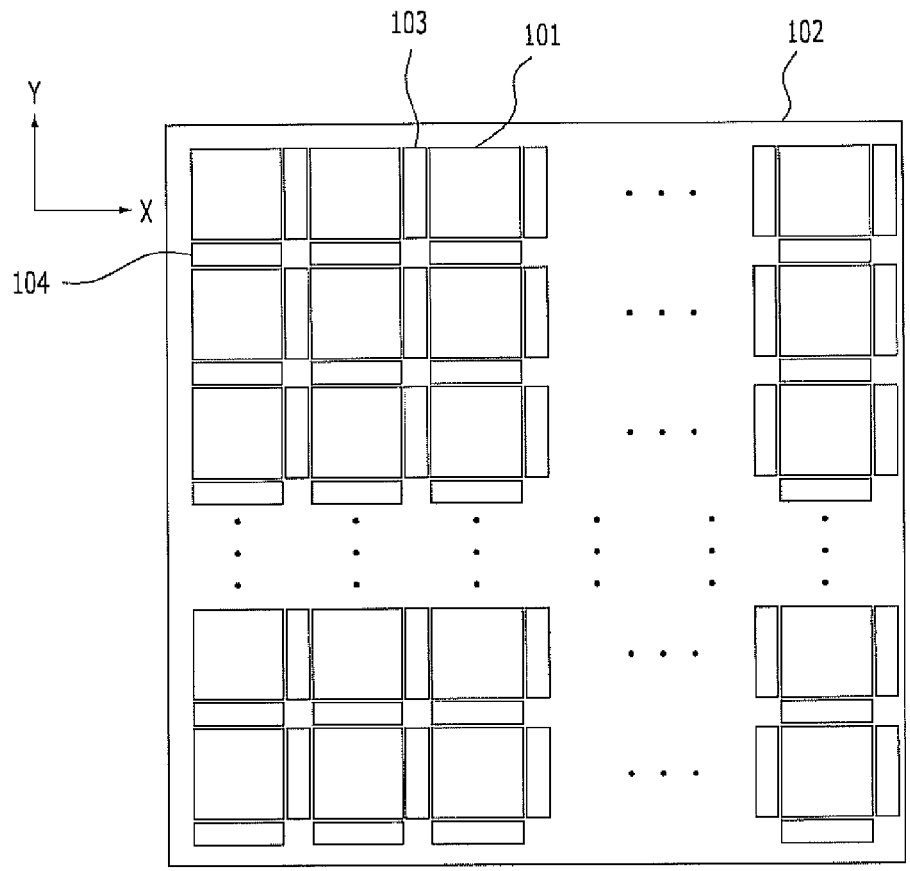
FIG. 1 is a plan view illustrating a DRAM.
Figure 2:
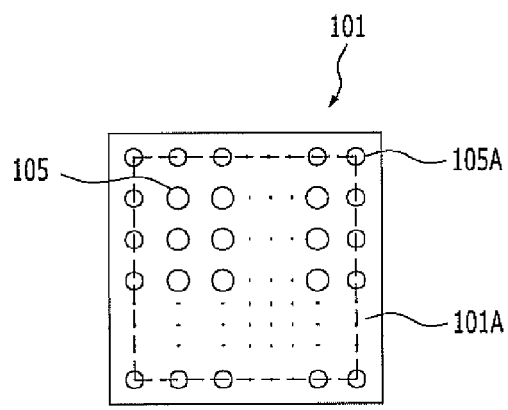
FIG. 2 is a plan view illustrating a detailed structure of a cell array having a plurality of patterns formed therein.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

The present invention uses the concept of maintaining the uniformity of an exposure process, that is, the concept of simultaneously exposing a cell array and a region for forming a sense amplifier and a sub-word line driver.

The present invention performs a primary exposure process to form a first photoresist layer on the entire of a region for forming a sense amplifier and a sub-word line driver, and performs a secondary exposure process to form desired hole patterns. Herein, the first photoresist layer is not developed by the exposure in the secondary exposure process, and both the cell array region and the other region are simultaneously and uniformly exposed in the secondary exposure process.

The reason for the occurrence of a pattern defect in the edge of the conventional cell array is that the exposure process uniformity degrades due to a pattern discontinuity in the cell array edge, that is, a change in the environment of the cell array edge. The present invention prevents/reduces such an occurrence by performing a uniform exposure process without a pattern discontinuity.

A basic structure of a cell array in accordance with embodiments of the present invention may be applied with the structure illustrated in FIG. 1.

Hereinafter, a cell array is referred to as a first region 201/301/401, and a region for forming a sense amplifier (SA) and a sub-word line driver (SWD) is referred to as a second region 202/302/402. Also, the cell array includes M×N cells arrayed. Accordingly, at least M×N patterns may be formed in the cell array. The patterns include hole patterns such as contact holes. As well know in the art, in the design of a DRAM, a plurality of cell arrays are disposed in each bank and a plurality of cells are disposed in each cell array. Also, all the fabrication processes may be performed in a is batch manner on all the banks. For the convenience of description, only one cell array is illustrated in the accompanying drawings.

FIGS. 3A to 3F are plan views illustrating a method for fabricating a semiconductor device in accordance with an embodiment of the present invention. FIGS. 4A to 4F are cross-sectional views taken along lines A-A' of FIGS. 3A to 3F, respectively.

Figure 3A:
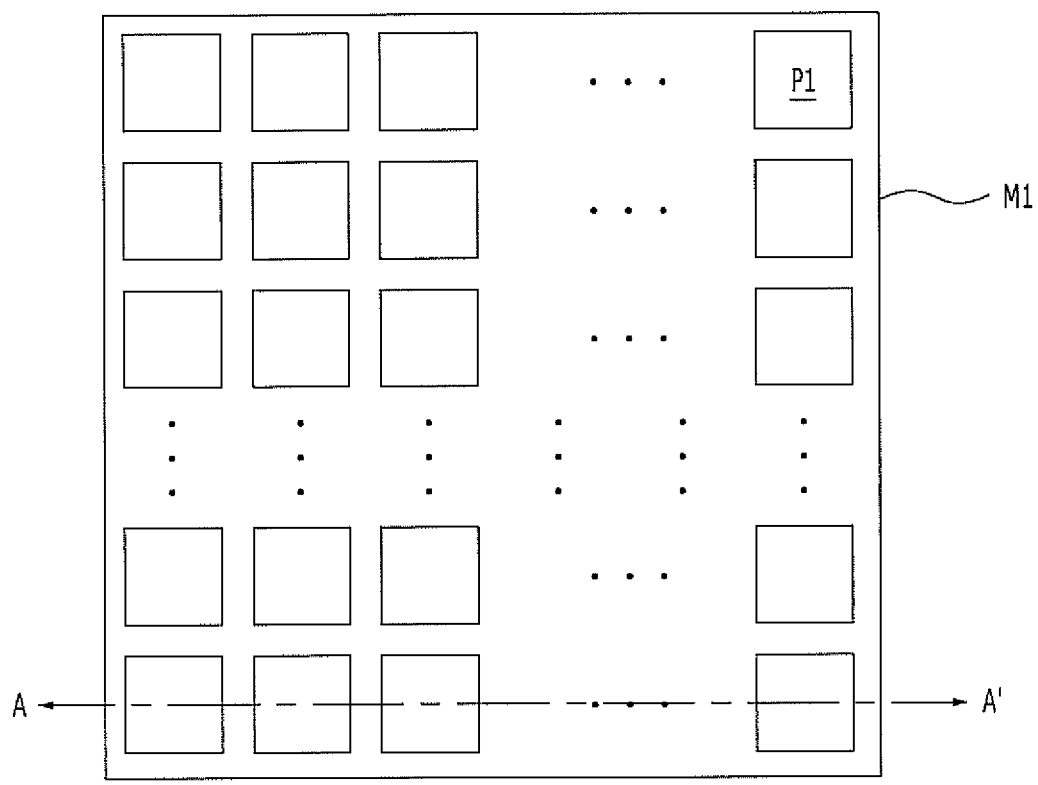
FIGS. 3A to 3F are plan views illustrating a method for fabricating a semiconductor device in accordance with an embodiment of the present invention.
Figure 4A:
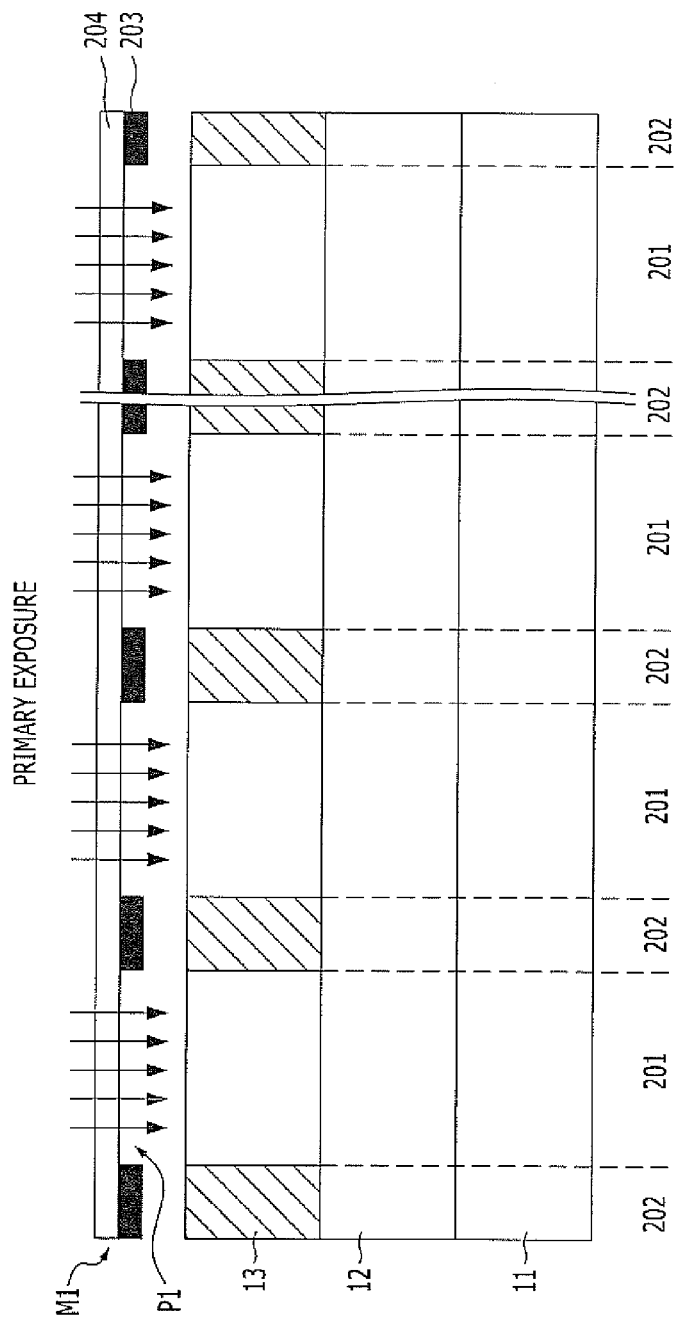

Referring to FIGS. 3A and 4A, an etch target layer 12 is formed on a substrate 11. The substrate 11 is divided into a first region 201 and a second region 202. The first region 201 includes a cell array region including a plurality of cell arrayed, and the second region 202 includes a region for forming a sense amplifier and a sub-word line driver. The etch target layer 12 includes a semiconductor layer, a dielectric layer, and a conductive layer. If the pattern to be formed subsequently is a contact hole, the etch target layer 12 may include a dielectric layer such as an oxide layer. The first region 201 may include M×N cells arrayed.

A primary photolithography process is performed. The primary photolithography process includes: coating an etch target layer with a first photoresist layer; exposing the first photoresist layer by using a first mask; and developing the exposed first photoresist layer.

First, a first photoresist layer 13 is formed on the etch target layer 12. The first photoresist layer 13 may include a positive-type photoresist layer. The positive-type photoresist layer is a photoresist layer of which a portion exposed to light during an exposure process is removed by a development process.

A first mask M1 is designed to selectively expose the first region 201. The first mask M1 has a plurality of first transparent portions P1 to define an opening for the first region 201. The first transparent portion P1 may have various shapes such as tetragonal shapes. As well known in the art, the mask may include a chrome region and a non-chrome region (e.g., a quartz region), wherein the chrome region is a non-transparent region blocking light and the non-chrome region is a transparent region transmitting light. The mask is also called a photomask or a reticle. The size of the first transparent portion P1 of the first mask M1 is defined by the non-chrome region 204 and the chrome region 203. The first transparent portion P1 is a region that transmits light in the subsequent exposure process. The first transparent portion P1 has the same arrangement as the first region 201. The first mask M1 is used to perform a primary exposure process that exposes the first photoresist layer 13.

Figure 3B:
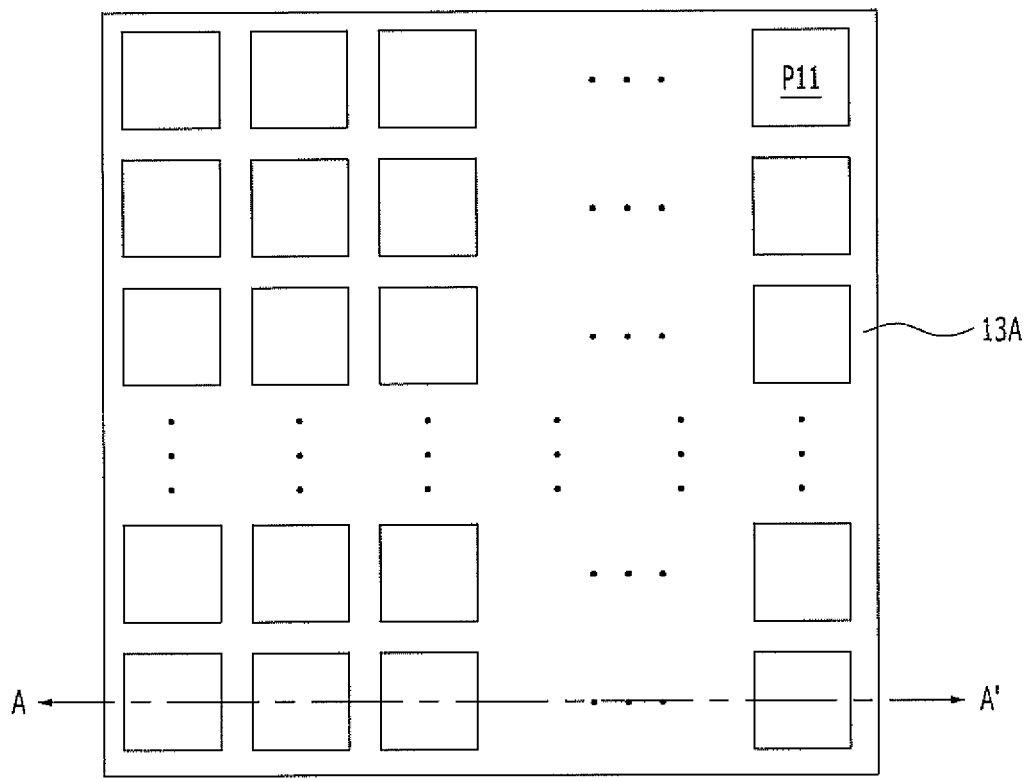
Figure 4B:
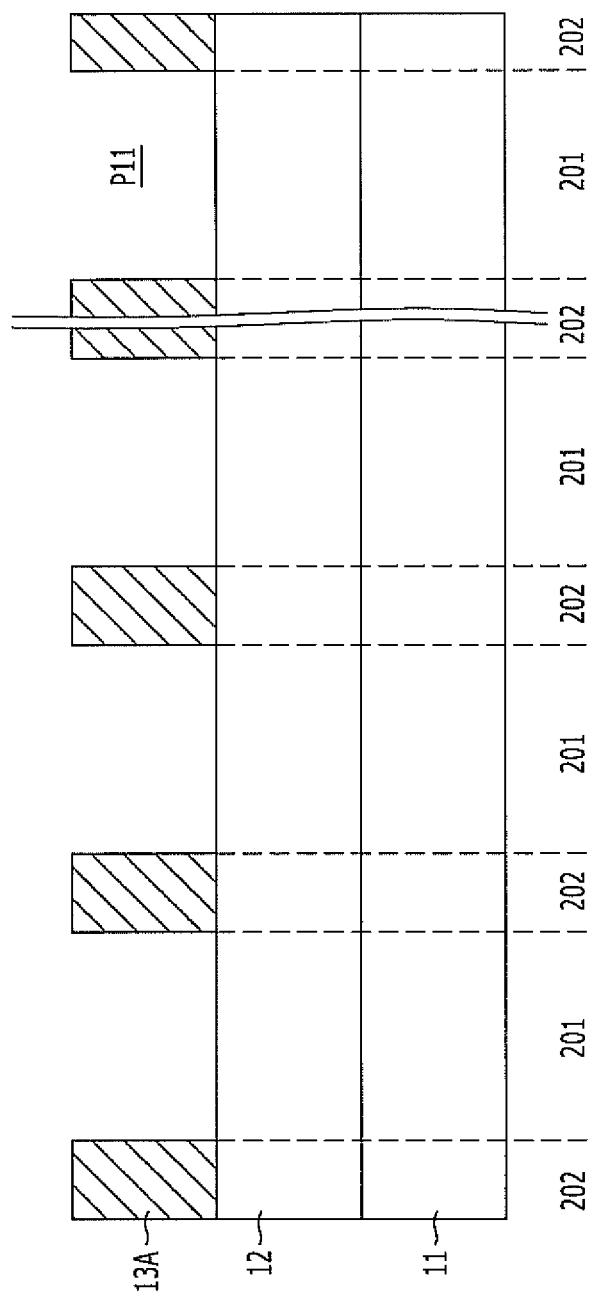

Referring to FIGS. 3B and 4B, the first photoresist layer 13 is developed after the primary exposure process. Accordingly, the portion exposed to the light in the primary exposure process is removed to form a first photoresist pattern 13A having a plurality of first openings P11. The first opening P11 is formed in plurality corresponding to the first transparent portions P1 for the first region 201. The first opening P11 is larger than a second opening P21 that is described below.

Figure 3C:
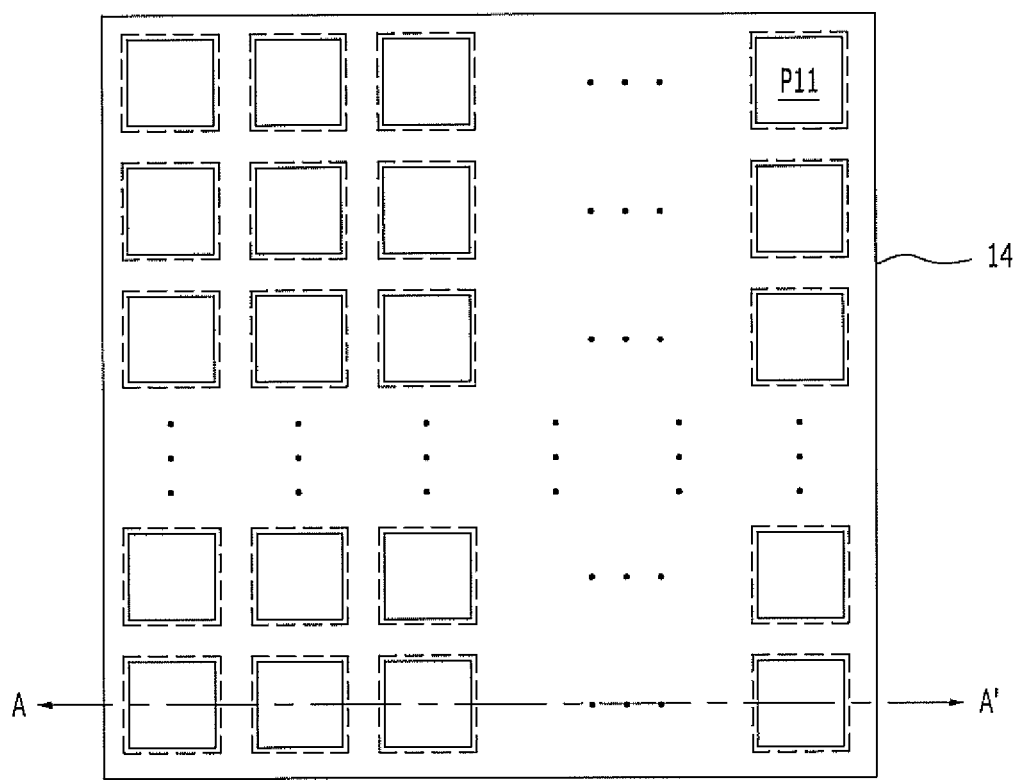
Figure 4C:
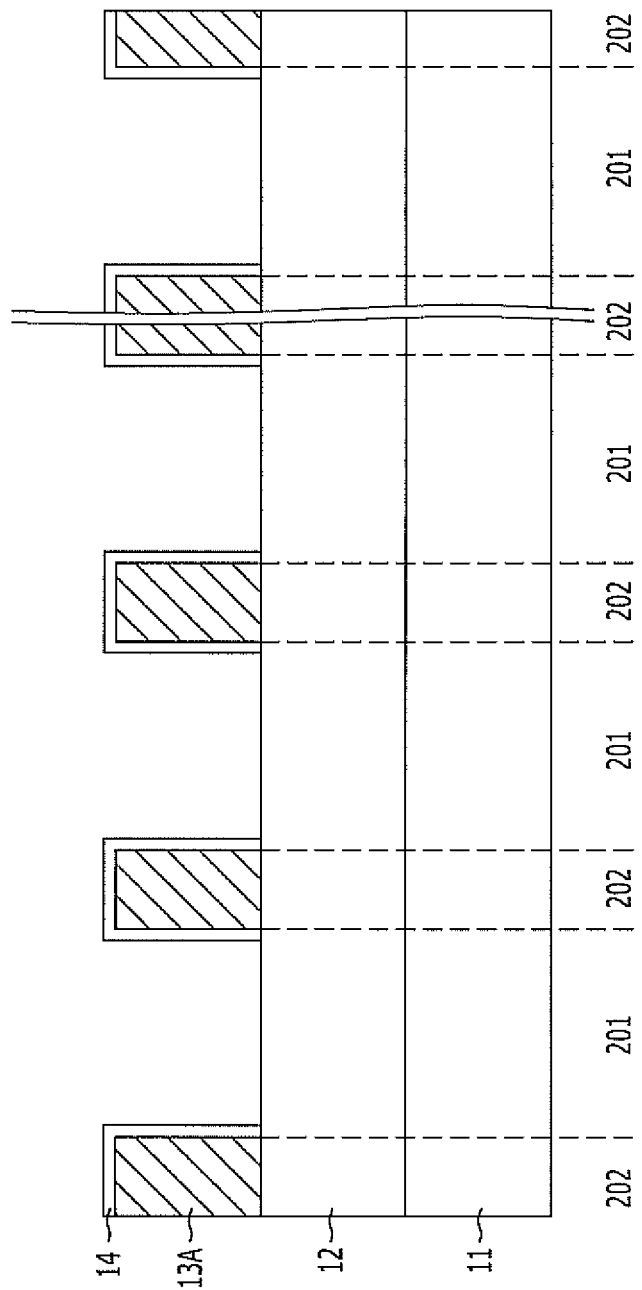

Referring to FIGS. 3C and 4C, a shielding layer 14 is formed to prevent the first photoresist pattern 13A from being exposed in the subsequent secondary exposure process, that is, to block the exposure of the secondary exposure process. For example, a freezing process may be performed to form the shielding layer 14.

The freezing process is to prevent the photoresist layer from being developed even though the photoresist layer is exposed to the light in the exposure process. The freezing process may include: coating the photoresist layer surface with a freezing agent; and baking the resulting structure. If a freezing process is used, the first photoresist pattern 13A may be formed in a plurality of divided patterns to facilitate the freezing process. For example, other portions than the first opening P11 are divided into minute patterns, and a freezing process is performed on all the surfaces including the divided portions. Accordingly, other surfaces than the first opening P11 are frozen.

The first photoresist pattern 13A with the shielding layer 14 still has the plurality of first openings P11 for the first region 201. Even though the line width may change due to the shielding layer 14, the line width change may be negligible.

A secondary photolithography process is performed. The secondary photolithography process includes: coating a first photoresist pattern with a second photoresist layer; exposing the is second photoresist layer by using a second mask; and developing the exposed second photoresist layer.

Figure 3D:
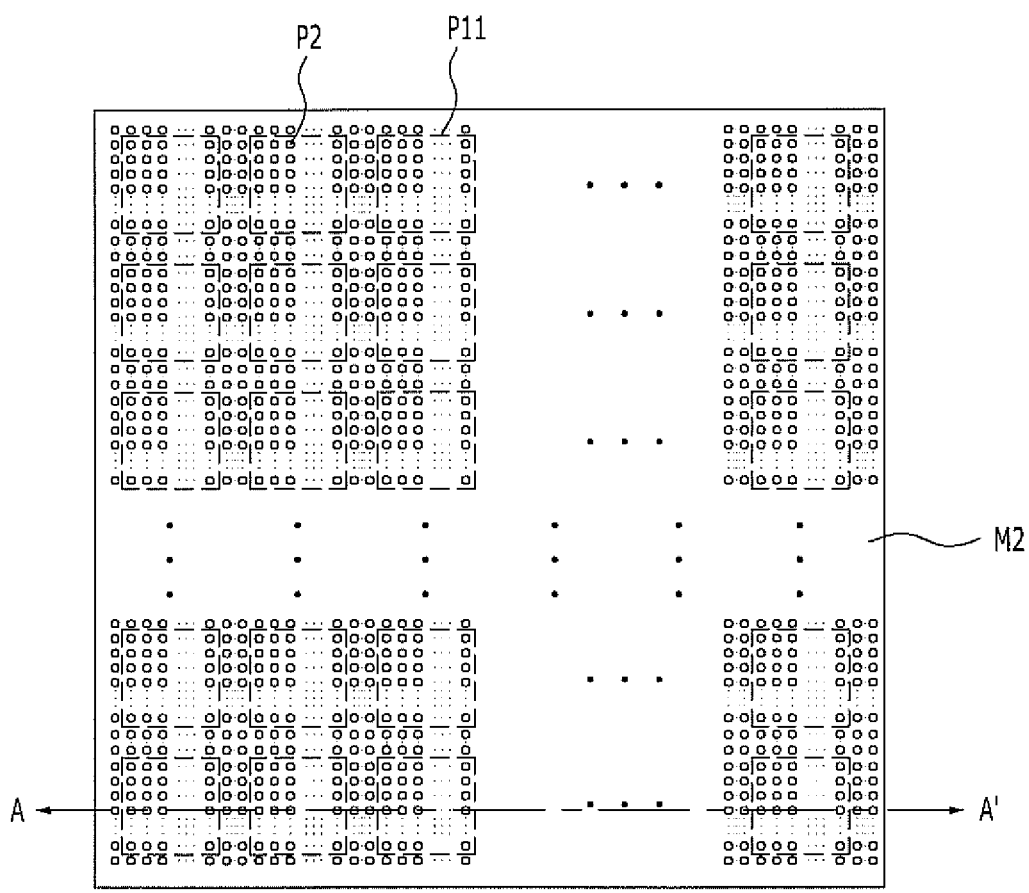

Referring to FIGS. 3D and 4D, a second photoresist layer 15 is formed on the first photoresist pattern 13A with the shielding layer 14 formed thereon. The second photoresist layer 15 may include a positive-type photoresist layer. The positive-type photoresist layer is a photoresist layer which of a portion exposed to the light of an exposure process is removed by a development process.

A second mask M2 is designed to simultaneously expose the first region 201 and the second region 202. Also, the second mask M2 is designed to simultaneously expose the inside of the first region 201 and the edge of the first region 201. The second mask M2 has a plurality of second transparent portions P2 defined therein. The second transparent portion P2 is smaller than the first transparent portion P1, and the second transparent portion P2 constitutes a hole array having a plurality of holes arrayed. The hole array may include a line and space. The size of the second transparent portion P2 of the second mask M2 is defined by a non-chrome region 206 and a chrome region 205. The second transparent portion P2 is a region that transmits light in the subsequent exposure process. Hereinafter, it is assumed that the second mask M2 has an hole array defined.

The second mask M2 is used to perform a secondary exposure process that exposes the second photoresist layer 15. In the secondary exposure process, the first photoresist pattern 13A is not exposed to the light by the shielding layer 14.

Figure 3E:
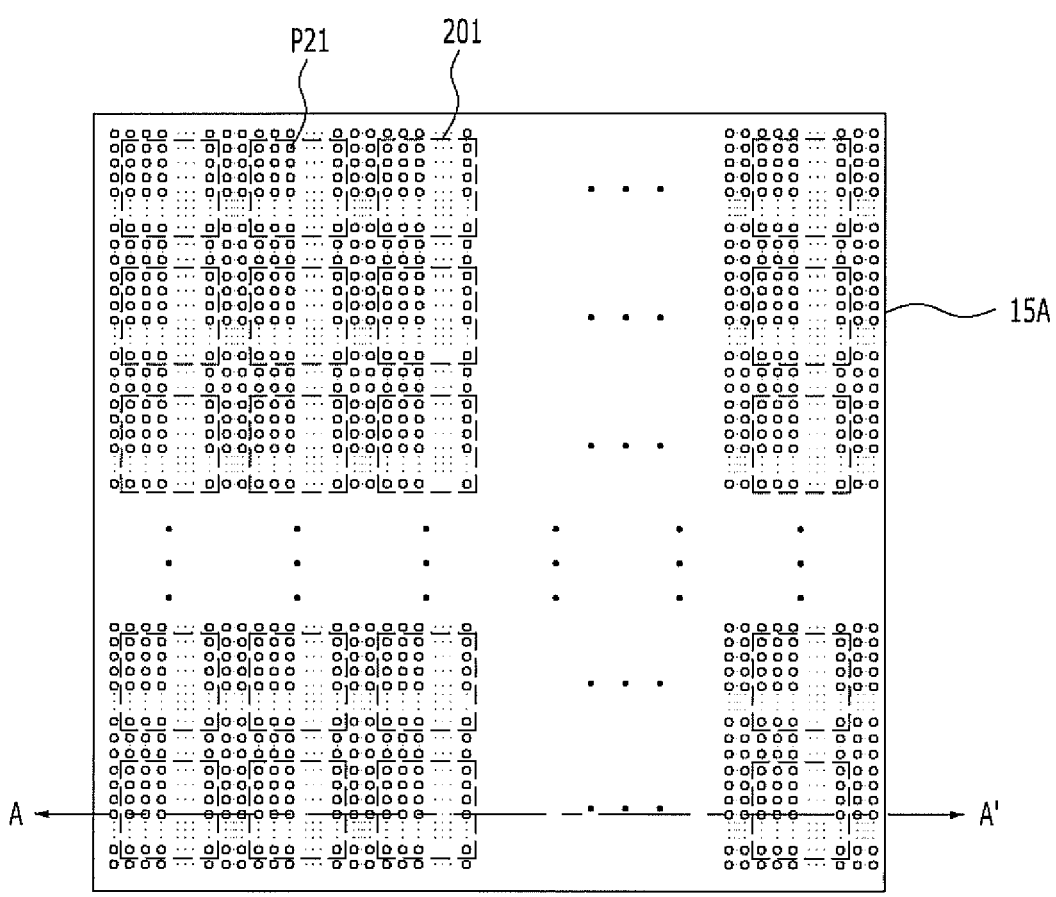
Figure 4E:
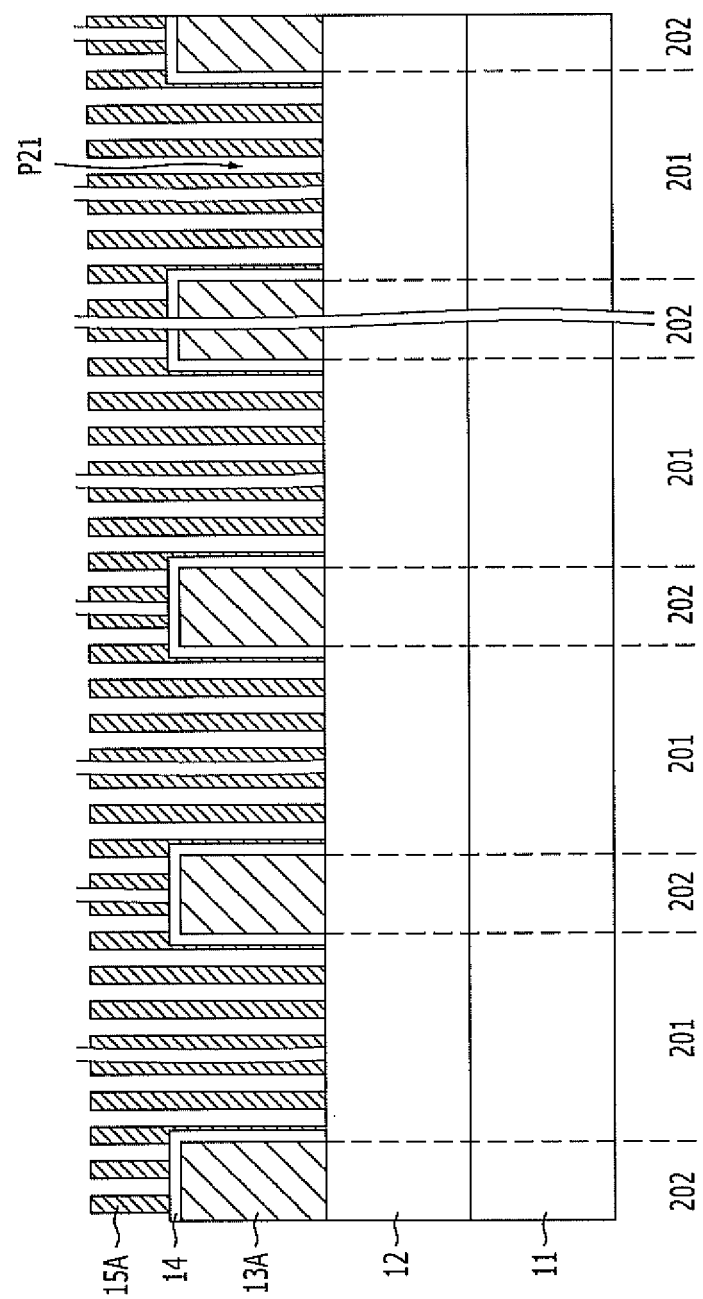

Referring to FIGS. 3E and 4E, the second photoresist layer 15 is developed after the secondary exposure process. Accordingly, the portion exposed to the light in the secondary exposure process is removed to form a second photoresist pattern 15A having a plurality of second openings P21. The second opening P21 formed in the second photoresist pattern 15A corresponds to the second transparent portion P2 of the second mask M2. A part of the second openings P21 expose the surface of the etch target layer 12 of the first region 201. In the second region 202 except the first region 201, the shielding layer 14 is exposed by the second openings P21.

Accordingly, the second openings P21 constitute an hole array having a plurality of holes arrayed. All of the second openings P21 have a uniform size. Also, the second opening P21 has a uniform size in the entire area of the first region 201 including its edge.

Because the first photoresist pattern 13A is protected by the shielding layer 14, it is not exposed/developed in the exposing/developing process for forming the second photoresist pattern 15A. Accordingly, the second opening P21 is not formed in the first photoresist pattern 13A, and the subsequent etching process is not perform in the etch target layer 12 of the second region 202. That is, although the exposure process for forming the second opening P21 is performed in both the first region 201 and the second region 202, because the second opening P21 is not formed in the first photoresist pattern 13A protected by the shielding layer 14, the etching process is not performed in the etch target layer 12 of the second region 202. That is, the second opening P21 exposes only the etch target layer 12 of the first region 201 and does not expose the etch target layer 12 of the second region 202.

According to the above description, the present invention simultaneously exposes the first region 201 and the second region 202 by using the second mask M2 designed to simultaneously expose the first region 201 and the second region 202 to form the second photoresist pattern 15A. Consequently, the light for forming the second opening P21 is totally irradiated to secure the pattern uniformity. The pattern uniformity is also secured in the entire first region 201 including its edge.

Figure 3F:
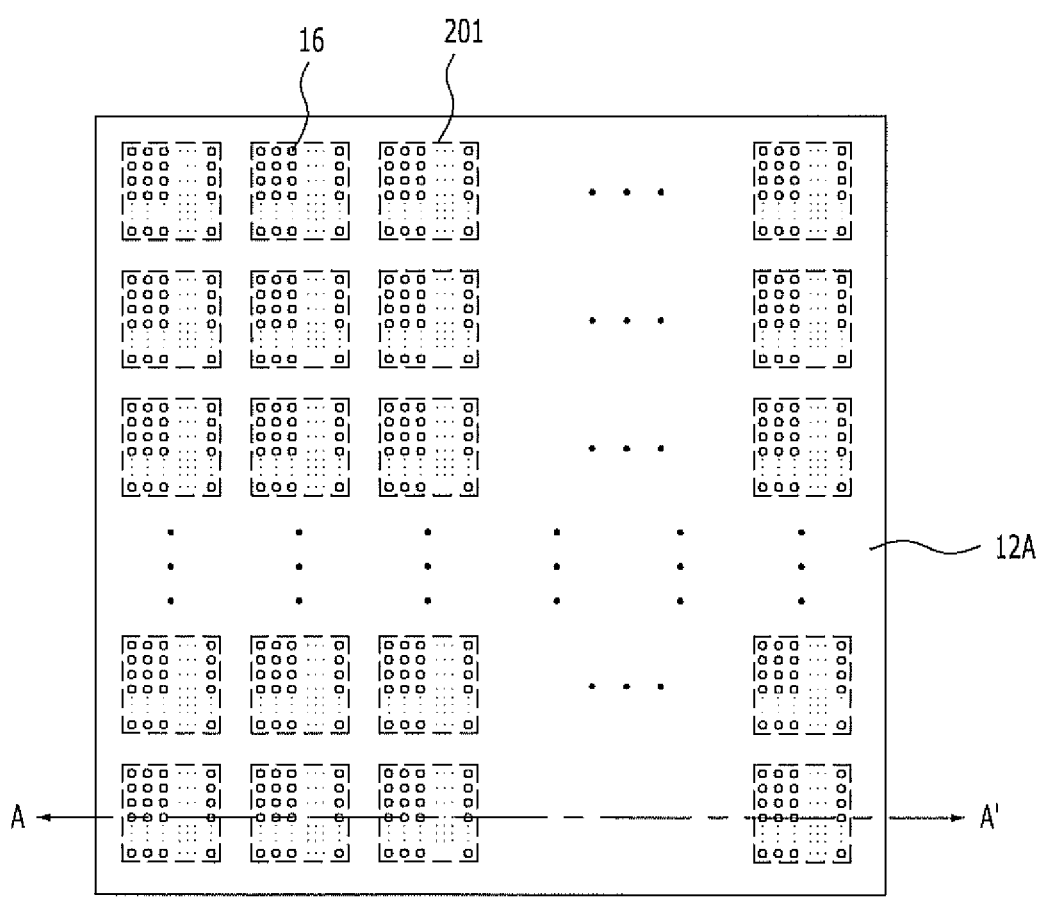
Figure 4F:
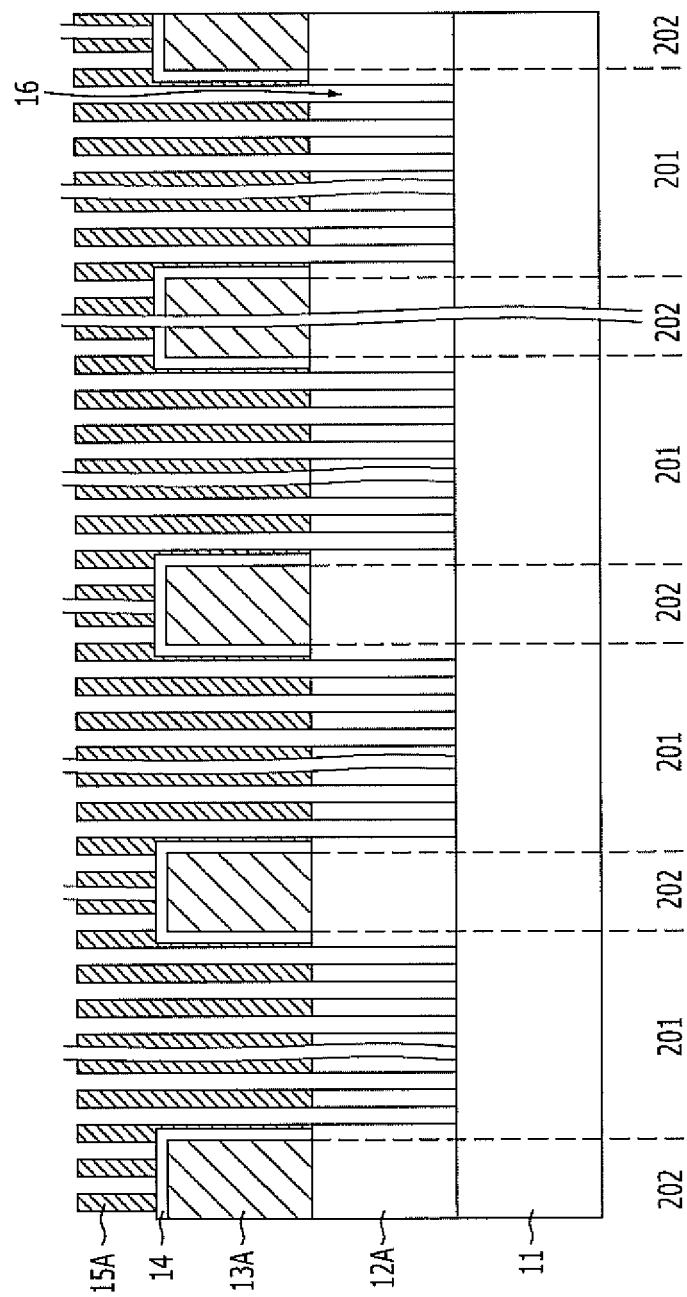

Referring to FIGS. 3F and 4F, using the second photoresist pattern 15A and the first photoresist pattern 13A as an etch barrier, the etch target layer 12 is etched to form a plurality of patterns 16. The patterns 16 include holes. The pattern may include one of a plug contact hole, a bit line contact hole, a storage node contact hole and a storage node pattern.

The patterns 16 are formed only in the first region 201. After the forming of the patterns 16, a reference numeral of the etch target layer becomes '12A'.

Because the first photoresist pattern 13A without the second opening covers the second region 202, an etching operation is not performed in the etch target layer 12 of the second region 202 in the etching process using the second photoresist pattern 15A and the first photoresist pattern 13A. Thus, the patterns 16 are formed only in the first region 201 and are not formed in the second region 202. Also, the use of the shielding layer 14 and the first photoresist pattern 13A makes the patterns 16 formed in a uniform size in the first region 201 including its edge. Accordingly, a distortion of the patterns 16 does not occur even in the edge of the first region 201.

Figure 4G:
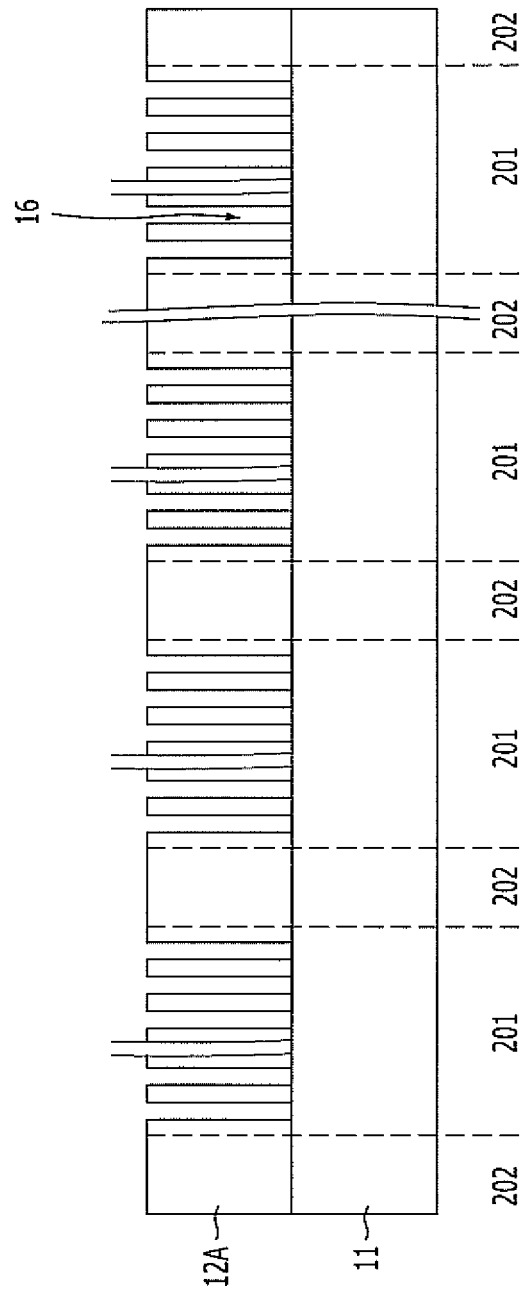
FIG. 4G is a cross-sectional view illustrating the semiconductor device in accordance with an embodiment of the present invention.

FIG. 4G is a cross-sectional view illustrating a final structure having the plurality of patterns 16 formed therein in accordance with the embodiment of the present invention.

Referring to FIG. 4G, the second photoresist pattern 15A, the shielding layer 14 and the first photoresist pattern 13A are removed. Accordingly, the plurality of patterns 16 are formed at the etch target layer 12A on the substrate 11.

FIGS. 5A to 5F are cross-sectional views illustrating a method for forming a storage node pattern in accordance with an embodiment of the present invention.

Figure 5A:
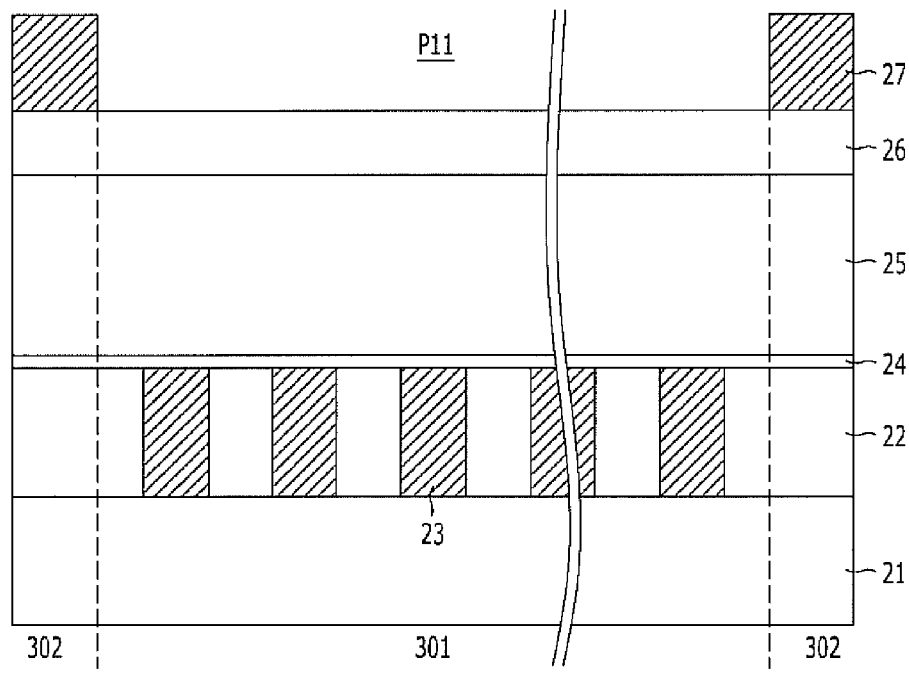
FIGS. 5A to 5F are cross-sectional views illustrating a method for forming a storage node pattern in accordance with an embodiment of the present invention.

Referring to FIG. 5A, an interlayer dielectric 22 is formed on a semiconductor substrate 21. The interlayer dielectric 22 includes an oxide layer. The semiconductor substrate 21 is divided into a first region 301 and a second region 302. The first region 301 is a cell array block having a plurality of cells formed therein, and the second region 302 is a region for forming a sense amplifier and a sub-word line driver. Although not illustrated in the drawings, a transistor including a source and a drain is formed in the first region 301, and a bit line is also formed in the first region 301.

A storage node contact mask forming process and an etching process are used to etch the interlayer dielectric 22, thereby forming a storage node contact hole (not illustrated). A storage node contact plug 23 is formed to be buried in the storage node contact hole and connected to the semiconductor substrate 21. The storage node contact plug 23 includes a conductive layer such as a polysilicon layer. The storage node contact plug 23 may be formed only in the first region 301, and may be formed to penetrate between the non-illustrated bit lines.

An etch stop layer 24 is formed on the entire surface of the resulting structure including the storage node contact plug 23. The etch stop layer 24 includes a nitride layer.

A dielectric layer 25 is formed on the etch stop layer 24. The dielectric layer 25 includes an oxide layer. The thickness of the dielectric layer 25 is determined in consideration of the height of a capacitor. For example, the dielectric layer 25 has a thickness of approximately 25000 Å.

A hard mask layer 26 is formed on the dielectric layer 25. A first photoresist pattern 27 is formed on the hard mask layer 26. The first photoresist pattern 27 has a first opening P11. The first opening P11 is configured to expose the first region 301 and cover the second region 302. The hard mask layer 26 may be formed under the first photoresist pattern 27, and an antireflection layer may be further formed therebetween to facilitate the photolithography process.

A primary photolithography process using the first mask M1 illustrated in FIGS. 3A and 4A may be used to form the first photoresist pattern 27. Herein, the first photoresist pattern 27 includes a positive photoresist layer. Also, a primary photolithography process using a first mask M10, which is described below with reference to FIGS. 6A and 7A, may be used to form the first photoresist pattern 27. Herein, the first photoresist pattern 27 includes a negative photoresist layer.

Figure 5B:
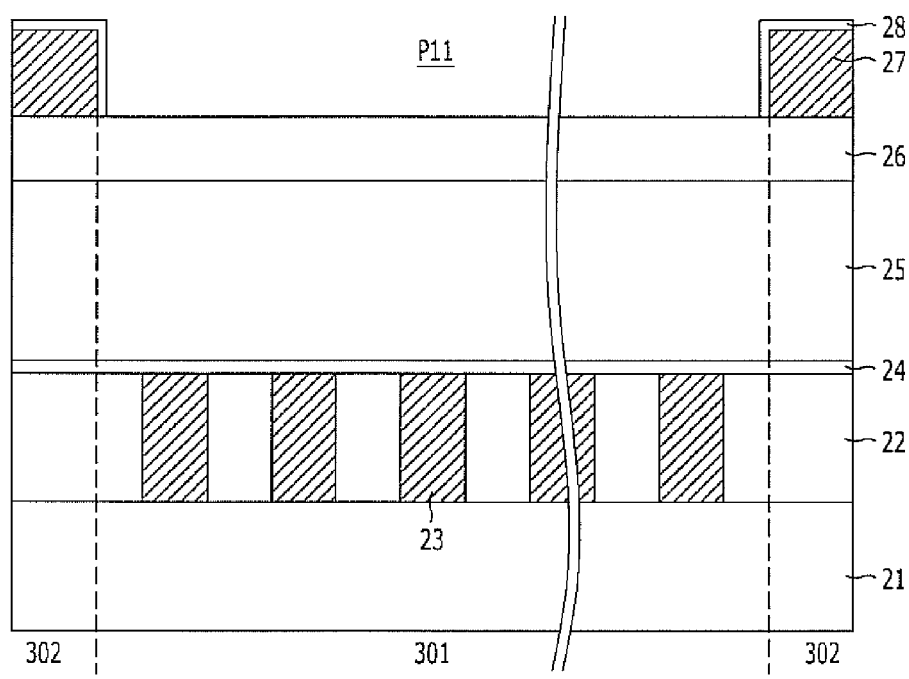

Referring to FIG. 5B, a shielding layer 28 is formed on the surface of the first photoresist pattern 27. For example, a freezing process may be performed to form the shielding layer 28.

The freezing process is to prevent the photoresist layer from being developed even though it is exposed to the light in the exposure process. The freezing process may include: coating the photoresist layer surface with a freezing agent; and baking the resulting structure. If a freezing process is used, the first photoresist pattern 27 may be formed in a plurality of divided patterns to facilitate the freezing process. For example, other portions than the first opening P11 are divided into minute patterns, and a freezing process is performed on all the surfaces including the divided portions. Accordingly, other surfaces than the first opening P11 are frozen.

Figure 5C:
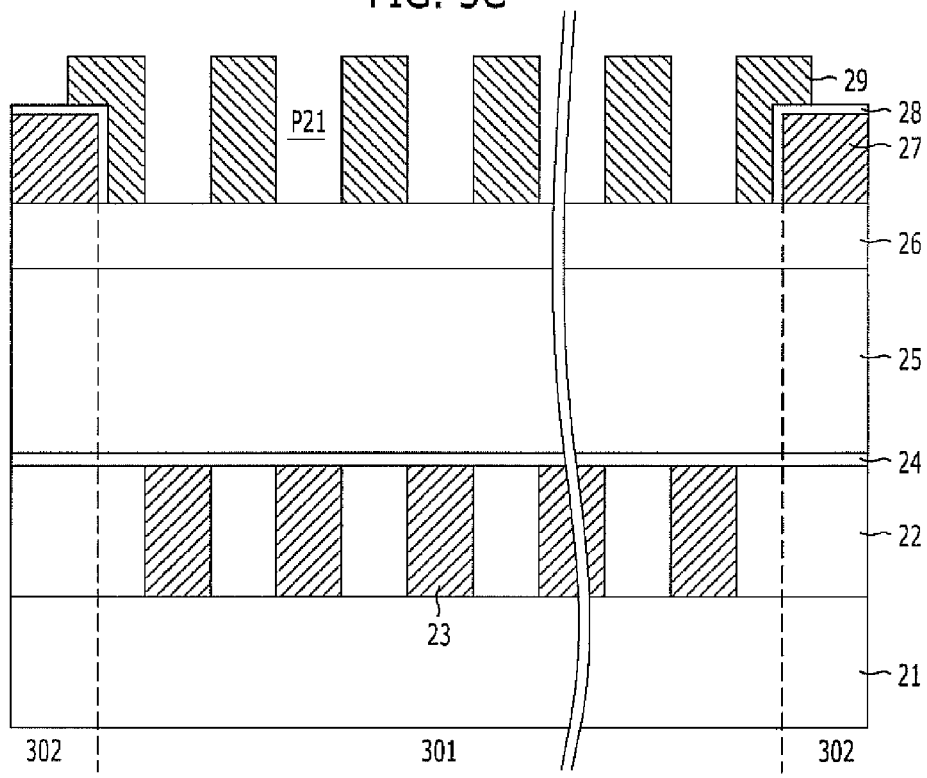

Referring to FIG. 5C, a second photoresist pattern 29 with a plurality of second openings P21 is formed on the first photoresist pattern 27 having the shielding layer 28 formed thereon. A secondary photolithography process using the second mask M2 illustrated in FIGS. 3D and 4D may be used to form the second photoresist pattern 29. If the first photoresist pattern 27 includes a negative photoresist layer, a secondary photolithography process using a second mask M20, which is described below with reference to FIGS. 6C and 7C, may be used to form the second photoresist pattern 29 without forming the shielding layer 28.

Figure 5D:
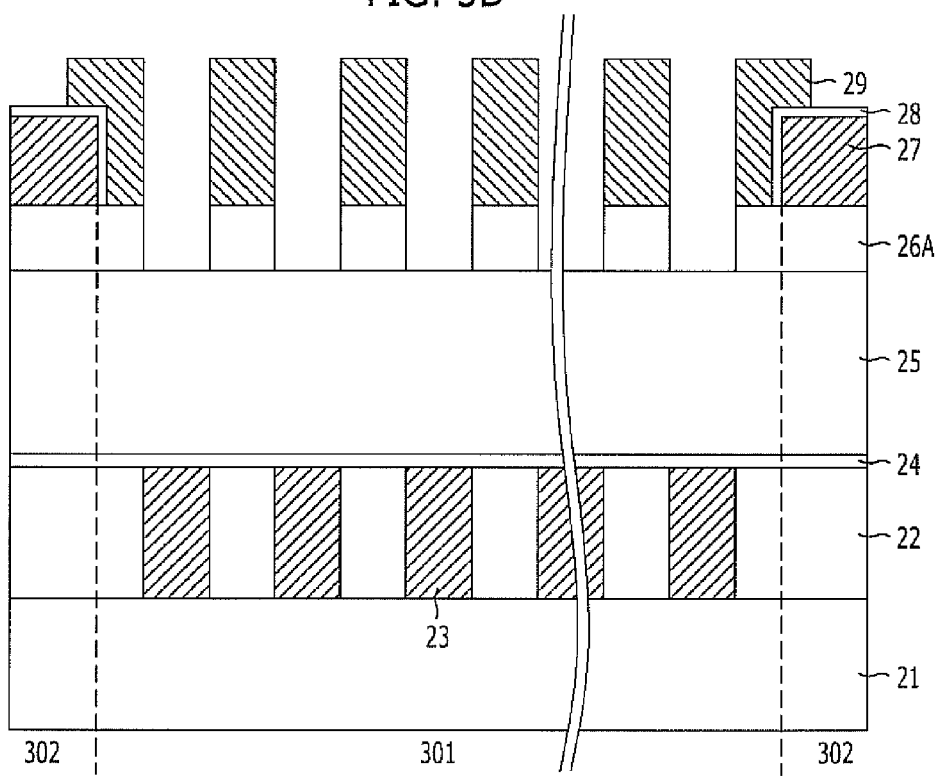

Referring to FIG. 5D, using the second photoresist pattern 29 and the first photoresist pattern 27 as an etch barrier, the hard mask layer 26 is etched to form a hard mask pattern 26A. The second opening P21 is transferred to the hard mask pattern 26A.

Figure 5E:
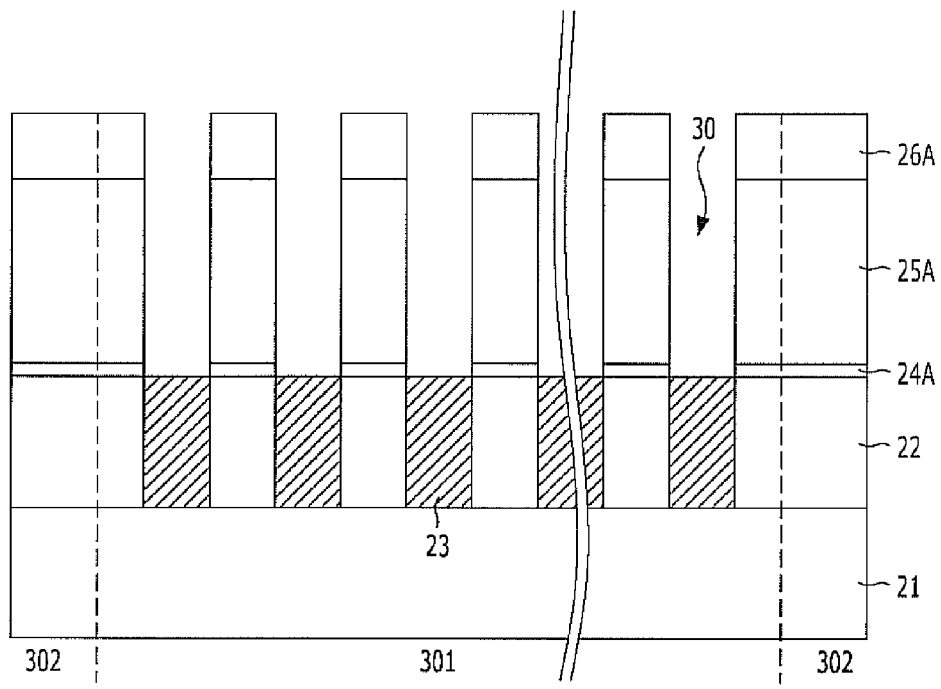

Referring to FIG. 5E, the first photoresist pattern 27, the shielding layer 28 and the second photoresist pattern 29 are stripped.

Using the hard mask pattern 26A as an etch barrier, the dielectric layer 25 and the etch barrier layer 24 are sequentially etched to form a storage node pattern 30. The storage node pattern 30 is a hole pattern. Generally, the storage node pattern 30 is a pattern for forming a three-dimensional cylinder-type or concave-type lower electrode. The storage node pattern 30 is formed only in the first region 301. The storage node pattern 30 constitutes an hole array formed in a stack structure of a etch stop layer pattern 24A and a dielectric layer pattern 25A.

The storage node pattern 30 formed at the core of the first region 301 and the storage node pattern 30 formed at the edge of the first region 301 has a uniform size.

Figure 5F:
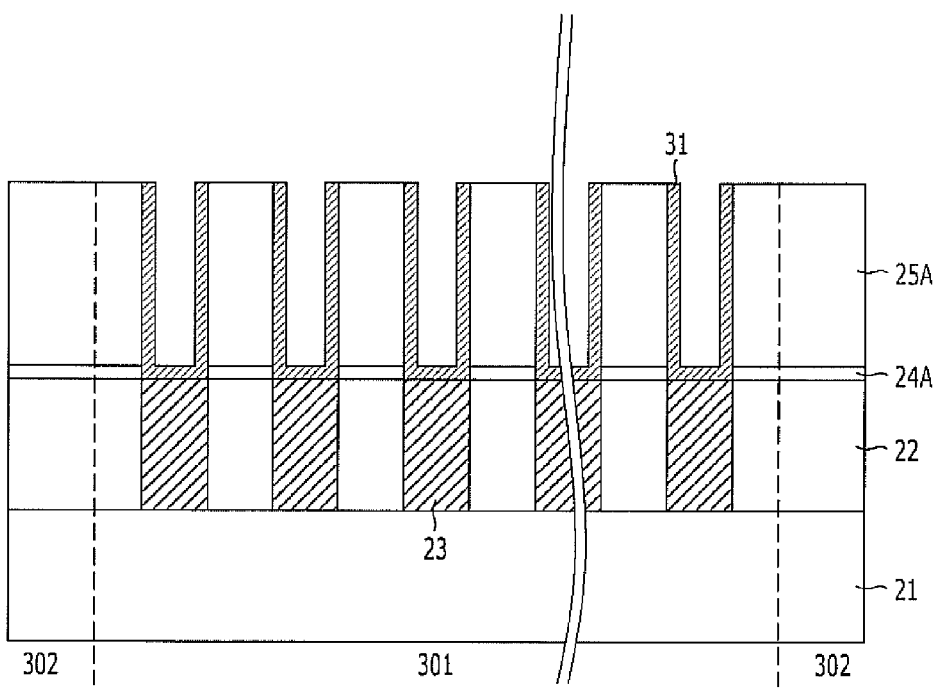

Referring to FIG. 5F, a cylinder-type storage node 31 is formed in the storage node pattern 30.

FIGS. 6A to 6E are plan views illustrating a method for fabricating a semiconductor device in accordance with another embodiment of the present invention. FIGS. 7A to 7E are cross-sectional views taken along lines A-A' of FIGS. 6A to 6E, respectively.

Figure 6A:
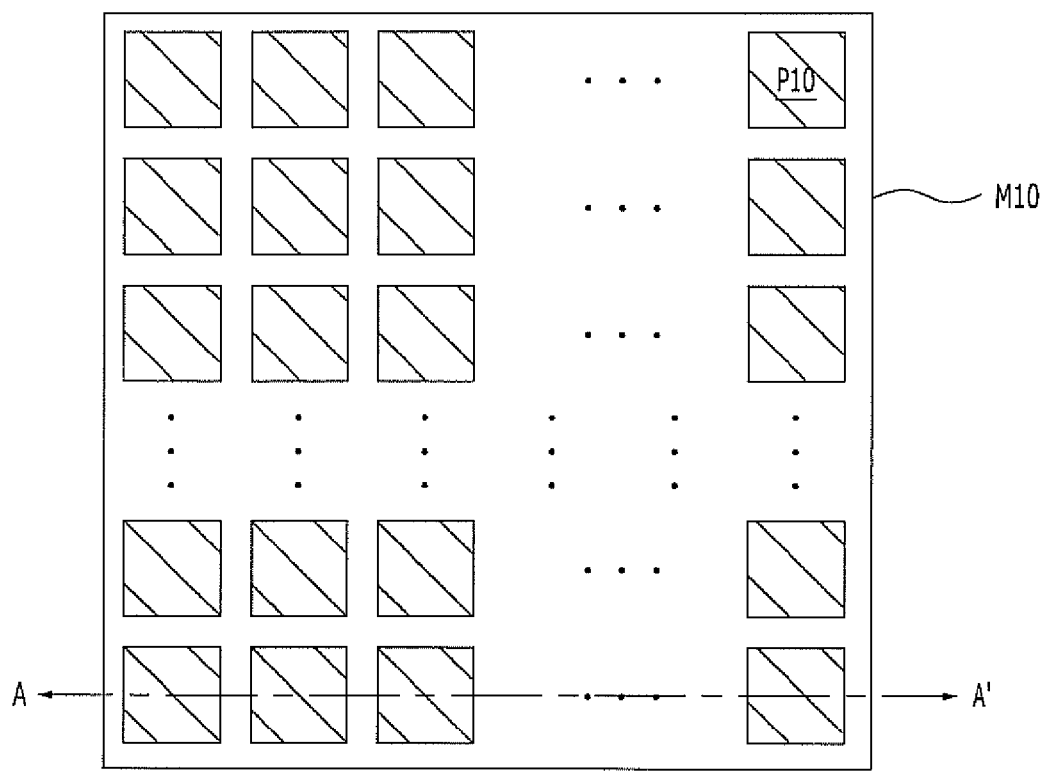
FIGS. 6A to 6E are plan views illustrating a method for fabricating a semiconductor device in accordance with another embodiment of the present invention.

Referring to FIGS. 6A and 7A, an etch target layer 32 is formed on a substrate 31. The substrate 31 is divided into a first region 401 and a second region 402. The first region 401 includes a cell array region including a plurality of cells arrayed, and the second region 402 includes a region for forming a sense amplifier and a sub-word line driver. The etch target layer 32 includes a semiconductor layer, a dielectric layer, and a conductive layer. If the pattern to be formed subsequently is a contact hole, the etch target layer 32 may include a dielectric layer such as an oxide layer. The first region 401 may include M×N cells arrayed.

A primary photolithography process is performed. The primary photolithography process includes: coating an etch target layer with a first photoresist layer; exposing the first photoresist layer by using a first mask; and developing the exposed first photoresist layer.

First, a first photoresist layer 33 is formed on the etch target layer 32. The first photoresist layer 33 may include a negative-type photoresist layer. The negative-type photoresist layer is a photoresist layer of which a portion not exposed to light during an exposure process is removed by a development process while the exposed portion remains in the development process.

A first mask M10 is designed to selectively expose the first region 401. The first mask M10 has a plurality of shielding portions P10 defined corresponding to the first region 401. The shielding portion P10 may have various shapes such as tetragonal shapes. As well known in the art, the mask may include a chrome region and a non-chrome region, wherein the chrome region is a non-transparent region blocking light and the non-chrome region is a transparent region transmitting light. The mask is also called a photomask or a reticle. The shielding portion P10 is a non-transparent region that is a chrome region, and the other portion except the shielding portion P10 is a transparent region that is a non-chrome region. The shielding portion P10 is a region that does not transmit light in the subsequent exposure process. The shielding portion P10 has the same arrangement as the first region 401. The first mask M10 is used to perform a primary exposure process that exposes the first photoresist layer 33.

Figure 6B:
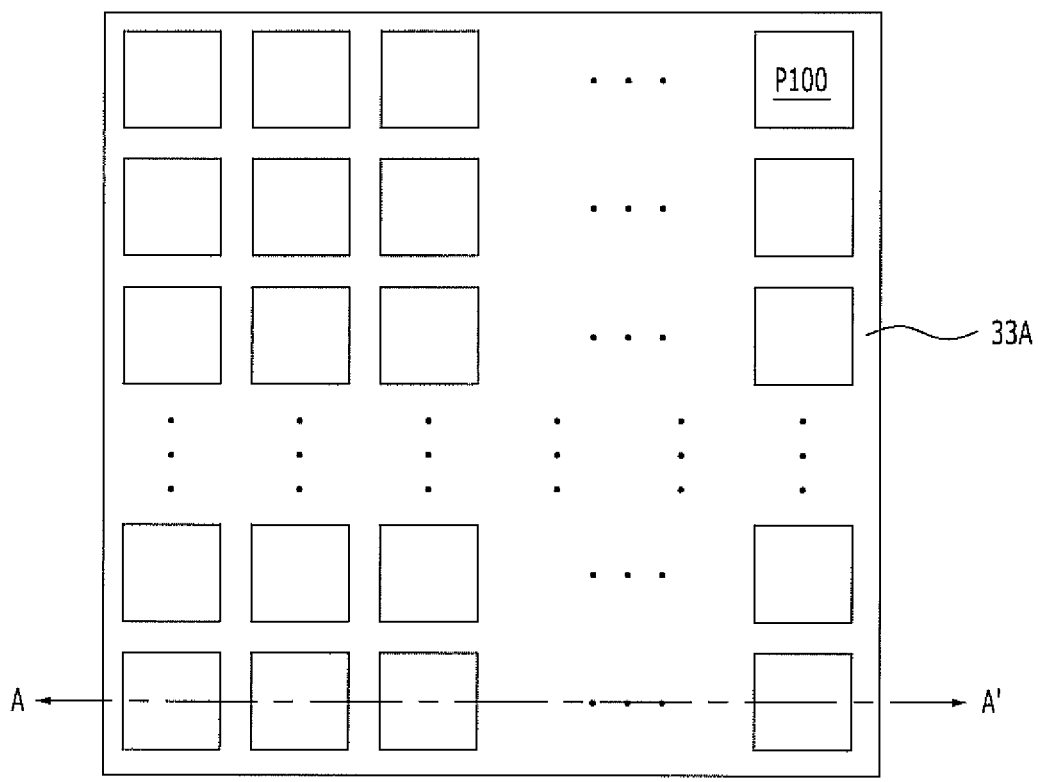

Referring to FIGS. 6B and 7B, the first photoresist layer 33 is developed after the primary exposure process. Accordingly, the portion, which is not exposed to the light in the primary exposure process, is removed to form a first photoresist pattern 33A having a plurality of first openings P100. The first region 401 is exposed by the first opening P100. The first opening P100 is formed in plurality in the same arrangement as the first opening P11 of the first embodiment. The first opening P100 is larger than a second opening P200 that is described below.

A secondary photolithography process is performed. The secondary photolithography process includes: coating a first photoresist pattern with a second photoresist layer; exposing the second photoresist layer by using a second mask; and developing the exposed second photoresist layer.

Figure 6C:
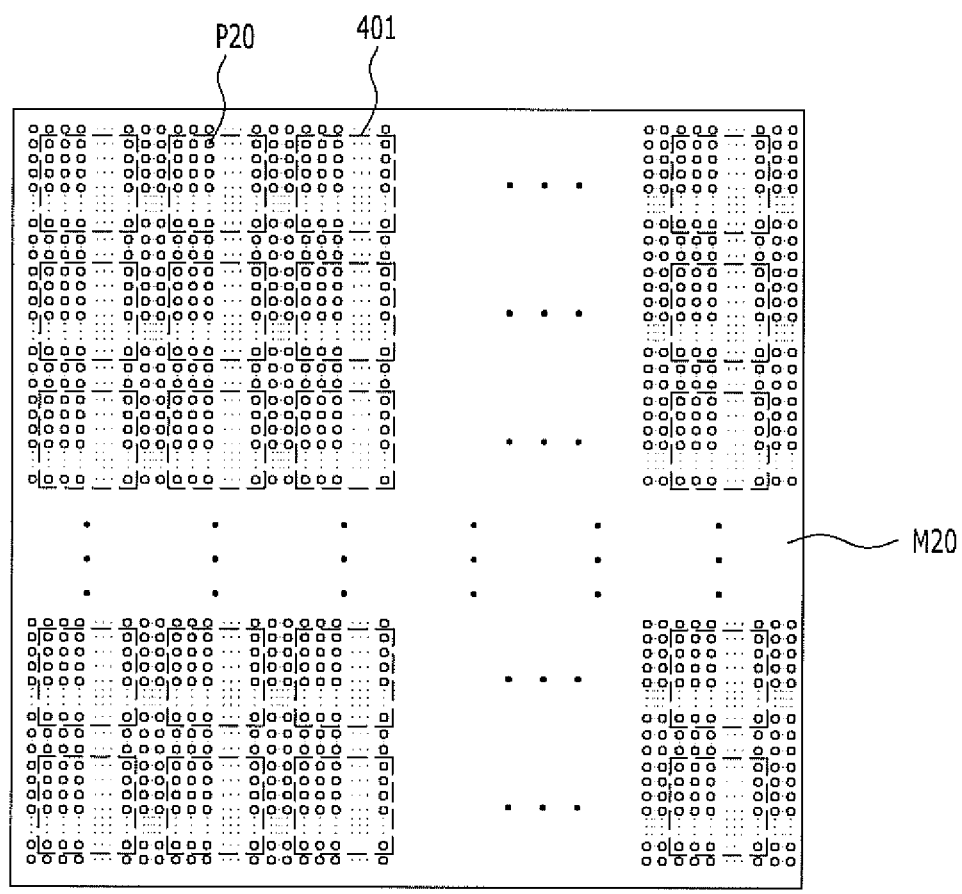
Figure 7C:
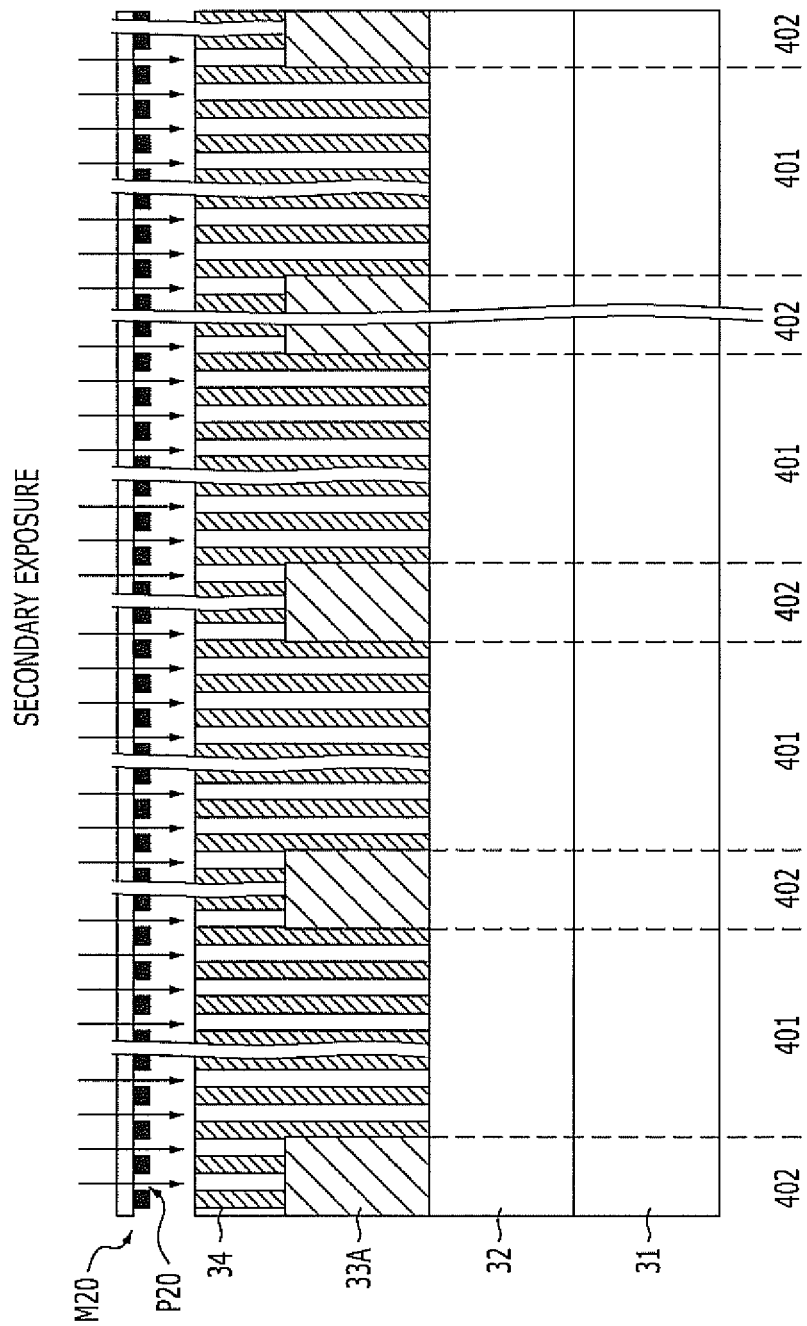

Referring to FIGS. 6C and 7C, a second photoresist layer 34 is formed on the first photoresist pattern 33A. The second photoresist layer 34 includes a positive-type photoresist layer. The positive-type photoresist layer is a photoresist layer of which a portion exposed to light during an exposure process is removed by a development process. In this manner, the second embodiment uses a negative-type photoresist layer in the primary photolithography process and uses a positive-type photoresist layer in the secondary photolithography process.

A second mask M20 is designed to simultaneously expose the first region 401 and the second region 402. Also, the second mask M20 is designed to simultaneously expose the inside of the first region 401 and the edge of the first region 401. The second mask M20 has a plurality of transparent portions P20 defined therein. The transparent portion P20 constitutes a hole array having a plurality of holes arrayed. The hole array may include a line and space. The size of the transparent portion P20 of the second mask M20 is defined by a non-chrome region and a chrome region. The transparent portion P20 is a region that transmits light in the subsequent exposure process. Hereinafter, it is assumed that the second mask M20 has an hole array defined.

The second mask M20 is used to perform a secondary exposure process that exposes the second photoresist layer 34. Because the first photoresist pattern 33A is a negative-type photoresist layer, it is not developed even though exposed to light during the secondary exposure process.

Figure 6D:
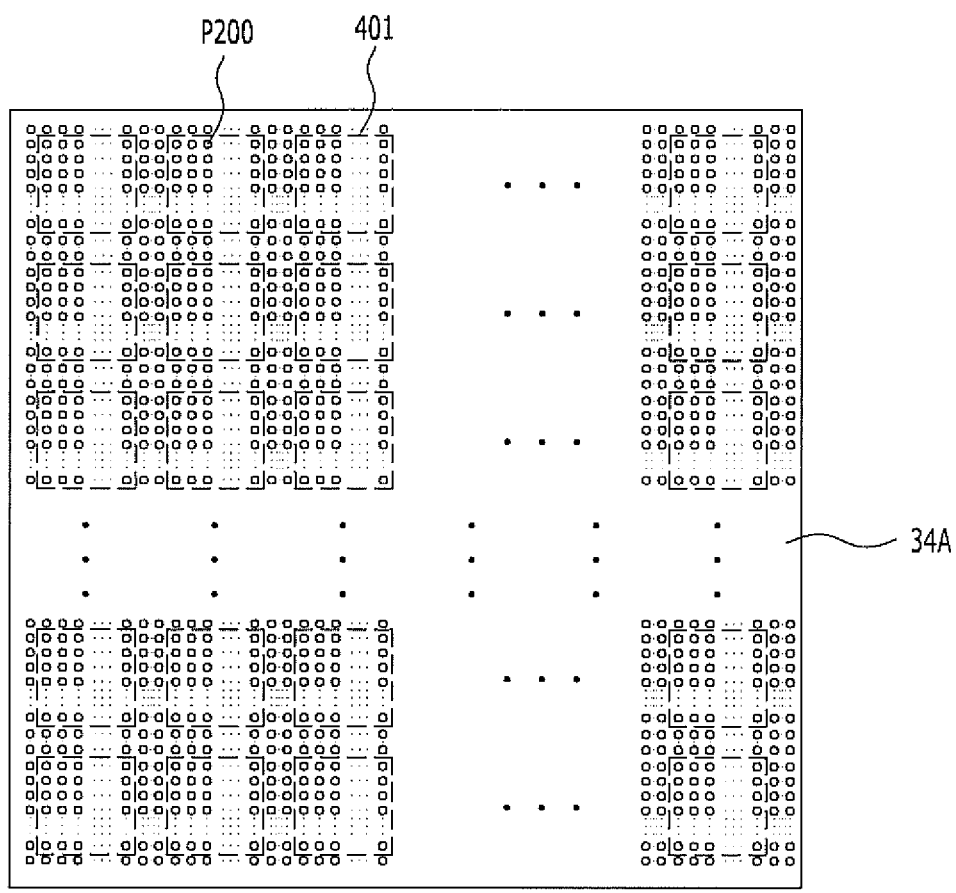
Figure 7D:
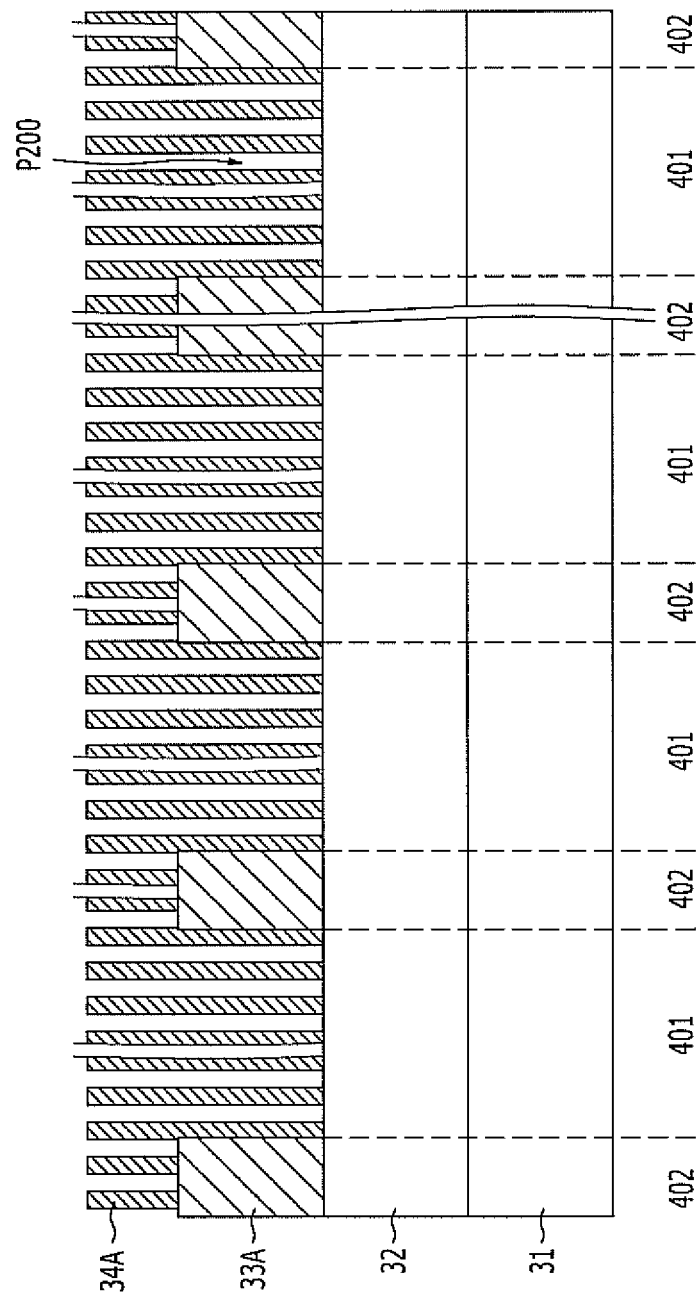

Referring to FIGS. 6D and 7D, the second photoresist layer 34 is developed after the secondary exposure process. Accordingly, the portion exposed to the light in the secondary exposure process is removed to form a second photoresist pattern 34A having a plurality of second openings P200. The second opening P200 formed in the second photoresist pattern 34A corresponds to the transparent portion P20 of the second mask M20. A part of the second openings P200 expose the surface of the etch target layer 32 of the first region 401. In the second region 402 except the first region 401, the first photoresist pattern 33A is exposed by the second openings P200.

Accordingly, the second opening P200 may be a hole type. All of the second openings P200 have a uniform size. Also, the second opening P200 has a uniform size at the core of the first region 401 and at the edge of the first region 401.

Because the first photoresist pattern 33A is a negative-type photoresist layer, it is not exposed/developed in the exposing/developing process for forming the second photoresist pattern 34A. Accordingly, the second opening P200 is not formed in the first photoresist pattern 33A, and the subsequent etching process is not perform in the etch target layer 32 of the second region 402. That is, although the exposure process for forming the second opening P200 is performed in both the first region 401 and the second region 402, because the second opening P200 is not formed in the first photoresist pattern 33A using a negative-type photoresist layer, the etching process is not performed in the etch target layer 32 of the second region 402.

According to the above description, the present invention simultaneously exposes the first region 401 and the second region 402 by using the second mask M20 designed to simultaneously expose the first region 401 and the second region 402 to form the second photoresist pattern 34A. Consequently, the light for forming the second opening P200 is totally irradiated to secure the pattern uniformity. The pattern uniformity is also secured at both of the core and edge of the first region 401.

Figure 6E:
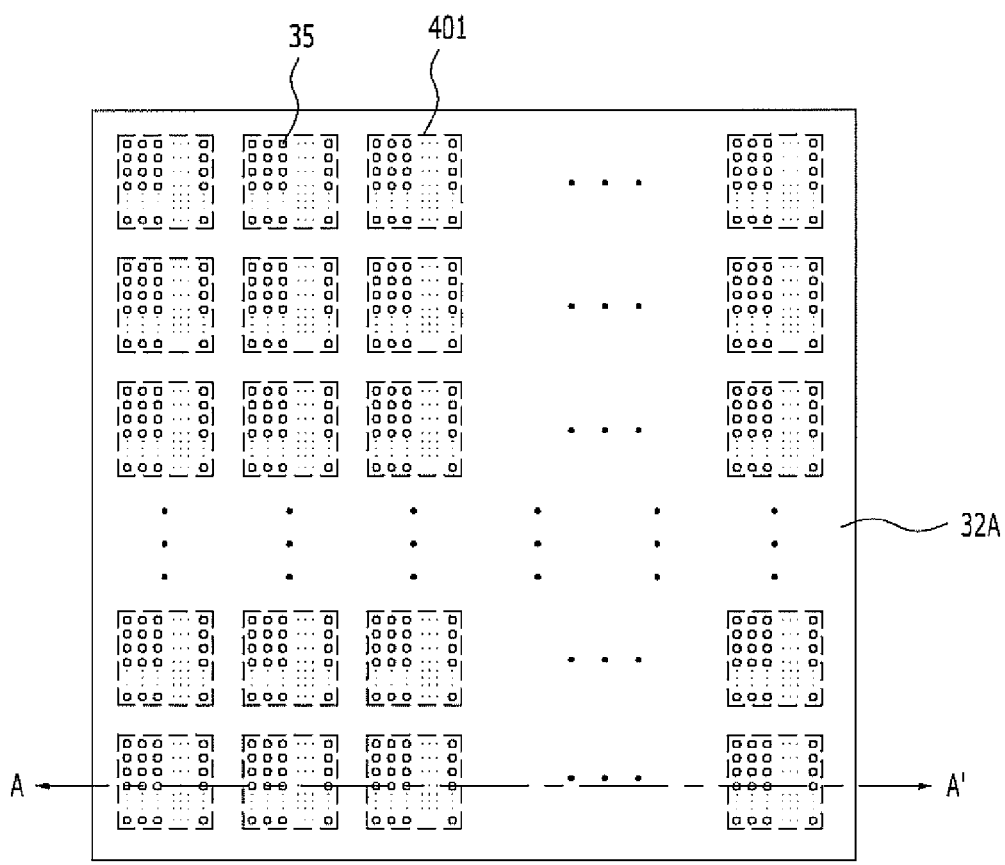
Figure 7E:
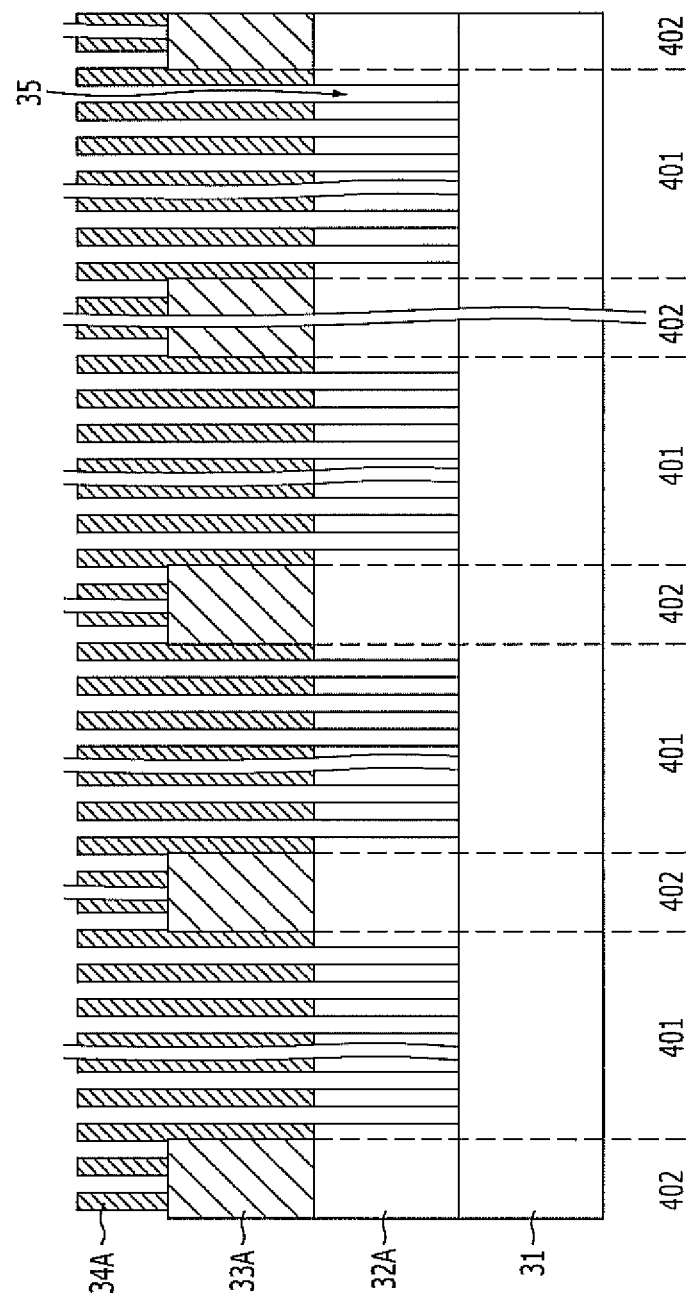

Referring to FIGS. 6E and 7E, using the second photoresist pattern 34A and the first photoresist pattern 33A as an etch barrier, the etch target layer 32 is etched to form a plurality of patterns 35. The patterns 35 include holes. The pattern may include one of a plug contact hole, a bit line contact hole, a storage node contact hole and a storage node pattern.

The patterns 35 are formed only in the first region 401. After the forming of the patterns 35, a reference numeral of the etch target layer becomes '32A'.

Because the first photoresist pattern 33A without the second opening covers the second region 402, an etching operation is not performed in the etch target layer 32 of the second region 402 in the etching process using the second photoresist pattern 34A and the first photoresist pattern 33A. Thus, the patterns 35 are formed only in the first region 401 and are not formed in the second region 402. Also, the use of the first photoresist pattern 33A formed of a negative-type photoresist layer makes the patterns 35 formed in a uniform size in the first region 401 including its edge. Accordingly, a distortion of the patterns 35 does not occur even in the edge of the first region 401.

Figure 7F:
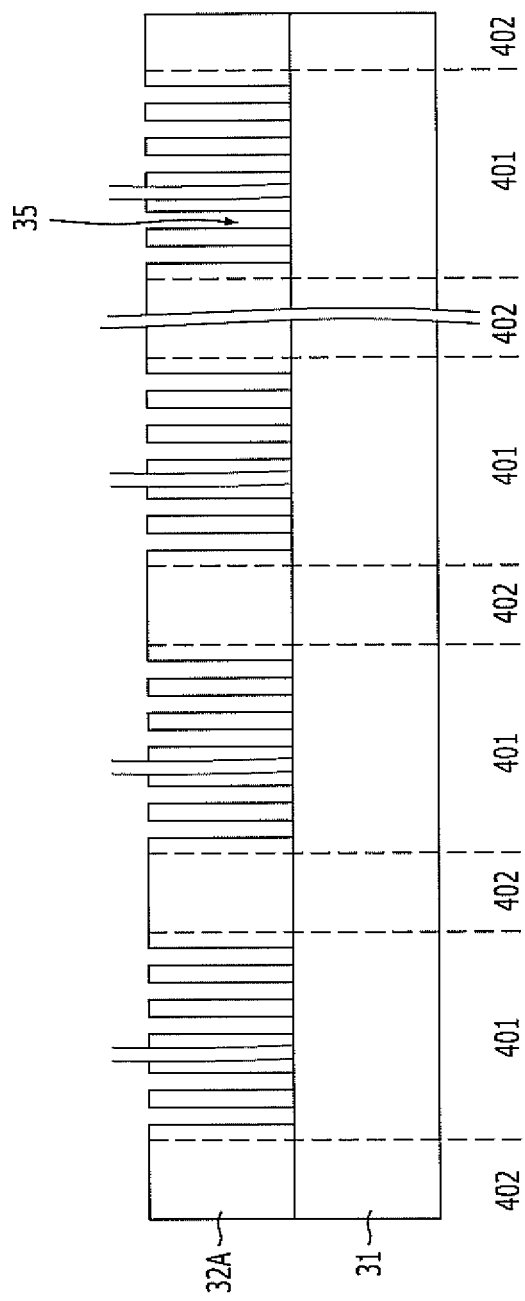
FIG. 7F is a cross-sectional view illustrating the semiconductor device in accordance with another embodiment of the present invention.

FIG. 7F is a cross-sectional view illustrating a final structure having the plurality of patterns 35 formed therein in accordance with another embodiment of the present invention.

Referring to FIG. 7F, the second photoresist pattern 34A and the first photoresist pattern 33A are removed. Accordingly, the plurality of patterns 35 are formed at the etch target layer 32A on the substrate 31.

The above embodiments of the present invention may be applicable to a method for forming a cell pattern in a cell array of a flash memory as well as in a cell array of a DRAM. Also, the above embodiments of the present invention may also be applicable to a method for forming line-type patterns (such as word lines and bit lines) in a DRAM or a flash memory.

As described above, the present invention can secure the pattern uniformity by simultaneously exposing the cell array and other regions than the cell array while protecting other regions than the cell array by using the shielding layer or the negative-type photoresist layer. Accordingly, the present invention can prevent a pattern defect in the edge of the cell array, thus improving the fabrication yield.

Also, the present invention can reduce the costs incurred by frequent mask revision.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, comprising:
    forming a first photoresist pattern with a first opening over an etch target layer;
    forming a second photoresist pattern with a plurality of second openings over the first photoresist pattern, wherein a size of the first opening is larger than a size of the second opening; and
    forming a plurality of patterns by etching the etch target layer by using the first photoresist pattern and the second photoresist pattern as an etch barrier.

2. The method of claim 1, after the forming of the first photoresist pattern, further comprising forming a shielding layer covering the first photoresist pattern.

3. The method of claim 2, wherein the shielding layer is formed through a freezing process.

4. The method of claim 3, wherein before the forming of the shielding layer, the first photoresist pattern is formed in a plurality of divided patterns to facilitate the freezing process.

5. The method of claim 2, wherein the first photoresist pattern and the second photoresist pattern include a positive-type photoresist layer.

6. The method of claim 2, wherein the first photoresist pattern includes a negative-type photoresist layer and the second photoresist pattern includes a positive-type photoresist layer.

7. The method of claim 1, wherein the second openings include a plurality of holes arrayed to form a hole array having an overlap area with the first opening.

8. The method of claim 1, wherein the patterns are formed only in the etch target layer of a region corresponding to the first opening.

9. A method for fabricating a semiconductor device, comprising:
  forming an etch target layer over a substrate having a first region and a second region defined therein;
  selectively exposing the first region to light to form a first photoresist pattern with a first opening over the etch target layer;
  forming a shielding layer over the surface of the first photoresist pattern;
  simultaneously exposing the first region and the second region to light to form a second photoresist pattern with a plurality of second openings over the first photoresist pattern covered with the shielding layer, wherein a size of the first opening is larger than a size of the second opening; and
  forming a plurality of patterns by etching the etch target layer by using the first photoresist pattern and the second photoresist pattern as an etch barrier.

10. The method of claim 9, wherein the forming of the first photoresist pattern comprises performing an exposing/developing process by using a mask having a transparent portion defined to correspond to the first region and the first opening.

11. The method of claim 9, wherein the forming of the second photoresist pattern comprises performing an exposing/developing process by using a mask having a plurality of transparent portions defined to correspond to the second openings.

12. The method of claim 9, wherein the second openings include a plurality of holes arrayed to form a hole array having an overlap area with the first opening.

13. The method of claim 9, wherein the first region includes a cell array having a plurality of cells arrayed, and the second region includes a sense amplifier and a sub-word line driver.

14. The method of claim 9, wherein the patterns are formed only in the etch target layer of the first region.

15. The method of claim 9, wherein the shielding layer is formed through a freezing process.

16. The method of claim 15, wherein before the forming of the shielding layer, the first photoresist pattern is formed in a plurality of divided patterns to facilitate the freezing process.

17. The method of claim 9, wherein the first photoresist pattern and the second photoresist pattern include a positive-type photoresist layer.

18. A method for fabricating a semiconductor device, comprising:
  forming an etch target layer over a substrate having a first region and a second region defined therein;
  forming a negative-type photoresist pattern with a first opening over the etch target layer, the first opening corresponding to the first region;
  simultaneously exposing the first region and the second region to light to form a positive-type photoresist pattern, which has a plurality of second openings over the first and second regions, over the negative-type photoresist pattern, the second opening corresponding to a plurality of pattern to be formed in the etch target layer of the first region, wherein a size of the first opening is larger than a size of the second opening; and
  forming the plurality of patterns by etching the etch target layer by using the negative-type photoresist pattern and the positive-type photoresist pattern as an etch barrier.

19. The method of claim 18, wherein the forming of the negative-type photoresist pattern comprises performing an exposing/developing process by using a mask having a shielding portion defined to correspond to the first region and the first opening.

20. The method of claim 18, wherein the forming of the positive-type photoresist pattern comprises performing an exposing/developing process by using a mask having a plurality of transparent portions defined to correspond to the second openings.

* * * * *